(12) United States Patent
Park et al.

(10) Patent No.: US 12,446,402 B2
(45) Date of Patent: Oct. 14, 2025

(54) LIGHT EMITTING DISPLAY DEVICE

(71) Applicant: Samsung Display Co., LTD., Yongin-si (KR)

(72) Inventors: Beom Soo Park, Seongnam-si (KR); Youngmin Kwon, Hwaseong-si (KR); Wang Jo Lee, Suwon-si (KR); Jin-Whan Jung, Yesan-gun (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 613 days.

(21) Appl. No.: 17/869,722

(22) Filed: Jul. 20, 2022

(65) Prior Publication Data

US 2023/0141774 A1  May 11, 2023

(30) Foreign Application Priority Data

Nov. 5, 2021 (KR) ........................ 10-2021-0151382

(51) Int. Cl.
*H01L 21/78* (2006.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10K 59/121; H10K 59/126
USPC ......................................................... 257/40
See application file for complete search history.

(56) References Cited

U.S. PATENT DOCUMENTS

| | | | | |
|---|---|---|---|---|
| 8,717,259 B2* | 5/2014 | Park | .................... | G09G 3/3225 |
| | | | | 345/82 |
| 9,245,480 B2* | 1/2016 | Kim | .................... | G09G 3/3258 |
| 9,406,702 B2* | 8/2016 | Wang | .................... | H10D 86/60 |
| 9,609,155 B2* | 3/2017 | Yoshida | ............. | H04N 1/00456 |
| 9,711,087 B2* | 7/2017 | Choi | .................... | G09G 3/3258 |
| 11,361,712 B2* | 6/2022 | Xu | ........................ | G09G 3/3275 |

(Continued)

FOREIGN PATENT DOCUMENTS

| | | |
|---|---|---|
| CN | 111477669 A | 7/2020 |
| KR | 101400284 B1 | 5/2014 |

(Continued)

*Primary Examiner* — Vu A Vu
(74) *Attorney, Agent, or Firm* — CANTOR COLBURN LLP

(57) ABSTRACT

A light-emitting display device includes a first transistor including a driving gate electrode, a first electrode, and a second electrode, a storage capacitor including a first electrode and a second electrode connected to the driving gate electrode, a second transistor connected to the second electrode of the storage capacitor, a first hold capacitor including a first electrode connected to the second electrode of the storage capacitor and a second electrode to which a driving voltage is applied, a second hold capacitor including a first electrode connected to the second electrode of the storage capacitor and a second electrode to which a driving voltage is applied, a third transistor connecting the driving gate electrode and the second electrode of the first transistor, and a light-emitting diode. Conductive layers in which the first electrode of the first hold capacitor and the first electrode of the second hold capacitor are disposed are different.

20 Claims, 18 Drawing Sheets

(56) References Cited

U.S. PATENT DOCUMENTS

| | | | |
|---|---|---|---|
| 11,744,112 B2* | 8/2023 | Yang | H10K 59/131 |
| | | | 257/40 |
| 2012/0026147 A1* | 2/2012 | Komiya | G09G 3/3233 |
| | | | 345/76 |
| 2017/0047390 A1* | 2/2017 | Lee | H10K 59/131 |
| 2017/0053975 A1* | 2/2017 | Cho | H10D 86/60 |
| 2019/0295469 A1* | 9/2019 | Umezawa | G09G 3/3233 |

FOREIGN PATENT DOCUMENTS

| | | |
|---|---|---|
| KR | 20200003333 A | 1/2020 |
| KR | 20200042161 A | 4/2020 |

\* cited by examiner

LIGHT EMITTING DISPLAY DEVICE

This application claims priority to Korean Patent Application No. 10-2021-0151382, filed on Nov. 5, 2021, and all the benefits accruing therefrom under 35 U.S.C. § 119, the content of which in its entirety is herein incorporated by reference.

BACKGROUND

1. Field

Embodiments of the invention relates to a light-emitting display device, and more specifically, to a light-emitting display device that may improve display quality by forming additional capacitance.

2. Description of the Related Art

A display device displays an image, and includes a liquid crystal display ("LCD"), an organic light-emitting diode ("OLED") display, and the like. The display device is used in various electronic devices such as a mobile phone, a navigation device, a digital camera, an electronic book, a portable game machine, and various terminals.

A light-emitting display device such as an organic light-emitting display device may have a structure that may be bent or folded by a flexible substrate.

SUMMARY

The described technology has been made in an effort to embodiments in which low-frequency driving is possible and that may reduce a luminance difference that may occur in a high gray during the low-frequency driving. The described technology has been made in an effort to embodiments in which high-frequency driving is possible and that may remove crosstalk or reduce power consumption during the high-frequency driving. The described technology has been made in an effort to provide embodiments that, even when driving voltages are not constant for respective positions in a panel, may provide uniform display regardless of a difference in the driving voltages. Embodiments are to improve display quality. In addition, embodiments are to provide a light-emitting display device having a high resolution or a high number of pixels per inch.

An embodiment provides a light-emitting display device including a first transistor including a driving gate electrode, a first electrode, and a second electrode, a storage capacitor including a first electrode and a second electrode connected to the driving gate electrode, a second transistor connected to the second electrode of the storage capacitor, a first hold capacitor including a first electrode connected to the second electrode of the storage capacitor and a second electrode to which a driving voltage is applied, a second hold capacitor including a first electrode connected to the second electrode of the storage capacitor and a second electrode to which a driving voltage is applied, a third transistor connecting the driving gate electrode and the second electrode of the first transistor, and a light-emitting diode including an electrode. Conductive layers in which the first electrode of the first hold capacitor and the first electrode of the second hold capacitor are disposed are different.

In an embodiment, the light-emitting display device may further include a substrate, a semiconductor layer disposed on the substrate, a first gate conductive layer disposed on the semiconductor layer, a second gate conductive layer disposed on the first gate conductive layer, and a first data conductive layer disposed on the second gate conductive layer. The driving gate electrode may be disposed in the first gate conductive layer, the second electrode of the storage capacitor may be disposed in the second gate conductive layer, and each of the driving gate electrode and the second electrode of the storage capacitor may extend in a first direction to have a T-shape.

In an embodiment, the first electrode of the first hold capacitor may be disposed in the first gate conductive layer, the first electrode of the second hold capacitor may be disposed in the second gate conductive layer, the second electrode of the first hold capacitor may be disposed in the second gate conductive layer, and the second electrode of the second hold capacitor may be disposed in the first data conductive layer.

In an embodiment, the first electrode of the first hold capacitor and the first electrode of the second hold capacitor may be connected by a connecting member disposed in the first data conductive layer.

In an embodiment, when a portion of the second electrode of the storage capacitor having the T-shape to extend in the first direction is also referred to as a first additional electrode of the second hold capacitor, the first additional electrode of the second hold capacitor, while at least partially overlapping a driving voltage line which is disposed in the first data conductive layer and to which the driving voltage is transmitted, may additionally constitute the second hold capacitor.

In an embodiment, the driving voltage line disposed in the first data conductive layer may be bent and extended in the first direction, and may include a portion extending in a second direction perpendicular to the first direction, and the portion extending in the second direction and the first additional electrode of the second hold capacitor may overlap in a plan view.

In an embodiment, the portion extending in the second direction of the driving voltage line disposed in the first data conductive layer may be a vertical portion or a shielding portion.

In an embodiment, the vertical portion and the shielding portion of the driving voltage line disposed in the first data conductive layer may be connected by a horizontal portion extending in the first direction.

In an embodiment, the light-emitting display device may further include a fourth transistor which initializes a voltage of the driving gate electrode to a first initialization voltage, and a fifth transistor changing a voltage of the second electrode of the storage capacitor to a reference voltage.

In an embodiment, the light-emitting display device may further include a sixth transistor connecting the electrode of the light-emitting diode and the second electrode of the first transistor, and a seventh transistor initializing the electrode of the light-emitting diode to a second initialization voltage.

In an embodiment, the light-emitting display device may further include an eighth transistor transmitting a bias voltage to the first electrode of the first transistor, and a ninth transistor transmitting the driving voltage to the first electrode of the first transistor. In an embodiment, a period in which the second transistor is turned on and a period in which the third transistor is turned on may be separated from each other, and the ninth transistor may be turned on during the period in which the third transistor is turned on.

In an embodiment, the sixth transistor and the ninth transistor are turned on together, so that the light-emitting diode may emit light.

In an embodiment, conductive layers in which the second electrode of the first hold capacitor and the second electrode of the second hold capacitor are disposed may be different.

Another embodiment provides a light-emitting display device, including a first transistor including a driving gate electrode, a first electrode, and a second electrode, a storage capacitor including a first electrode and a second electrode connected to the driving gate electrode, a second transistor connected to the second electrode of the storage capacitor, a first hold capacitor including a first electrode connected to the second electrode of the storage capacitor and a second electrode to which a driving voltage is applied, a second hold capacitor including a first electrode connected to the driving gate electrode and a second electrode to which a driving voltage is applied, a third transistor connecting the driving gate electrode and the second electrode of the first transistor, and a light-emitting diode including an electrode.

In an embodiment, the light-emitting display device may further include a fourth transistor which initializes a voltage of the driving gate electrode to a first initialization voltage, and a fifth transistor which changes a voltage of the second electrode of the storage capacitor to a reference voltage.

In an embodiment, the light-emitting display device may further include a sixth transistor connecting the electrode of the light-emitting diode and the second electrode of the first transistor, and a seventh transistor which initializes the electrode of the light-emitting diode to a second initialization voltage.

In an embodiment, the light-emitting display device may further include an eighth transistor which transmits a bias voltage to the first electrode of the first transistor, and a ninth transistor which transmits the driving voltage to the first electrode of the first transistor.

In an embodiment, a period in which the second transistor is turned on and a period in which the third transistor is turned on may be separated from each other, and the ninth transistor may be turned on during the period in which the third transistor is turned on.

In an embodiment, the sixth transistor and the ninth transistor are turned on together, so that the light-emitting diode may emit light.

By the embodiments, by further forming an additional capacitor in a pixel to maintain a voltage of a gate electrode of a first transistor, it is possible to reduce a luminance difference that may occur in a high gray during low-frequency driving and to eliminate crosstalk or reduce power consumption during high-frequency driving. Low frequency driving may be possible by including a transistor that applies a bias voltage to a pixel. High-speed driving is possible by separating a compensation period for compensating for a threshold voltage of a first transistor and a writing period for writing a data voltage in a pixel so that a compensation time is not insufficient, and by reducing influence of the driving voltage by a voltage written in the writing period, it is possible to display uniform luminance even though positions of the driving voltages are different. Due to at least one of the above effects, the display quality of the light-emitting display device may be improved. In addition, by further forming an additional capacitor in a pixel, it is not desired to increase a pixel area to have a target capacitance value, so since a pixel having a relatively small area may be formed or provided, a light-emitting display device having a high resolution or a high number of pixels per inch may be manufactured.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
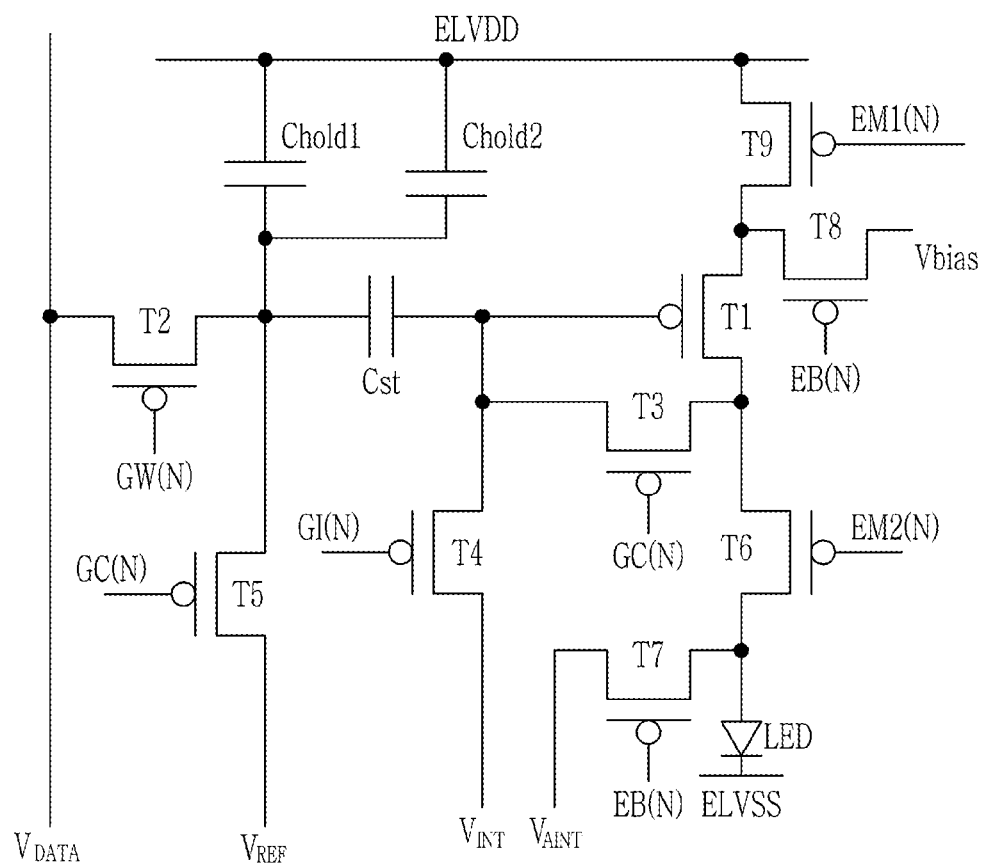
FIG. 1 illustrates an equivalent circuit diagram of an embodiment of one pixel included in a light-emitting display device.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the invention.

In order to clearly describe the invention, parts or portions that are irrelevant to the description are omitted, and identical or similar constituent elements throughout the specification are denoted by the same reference numerals.

Further, in the drawings, the size and thickness of each element are arbitrarily illustrated for ease of description, and the invention is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is also referred to as being "on" another element, it may be directly on the other element or intervening elements may also be present. In contrast, when an element is also referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "in a cross-section" means viewing a cross-section defined by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, a circuit structure of one pixel of a light-emitting display device in an embodiment will be described with reference to FIG. 1.

FIG. 1 illustrates an equivalent circuit diagram of an embodiment of one pixel included in a light-emitting display device.

A pixel of FIG. 1 is a pixel included in an N-th pixel row when a plurality of pixels are formed or provided in a display area of a light-emitting display device, which will now be described. Here, N is a natural number.

Referring to FIG. 1, one pixel includes a light-emitting diode LED and a pixel circuit part for driving the same, and the pixel circuit part is arranged in a matrix form. The pixel circuit part includes all other elements except for the light-emitting diode LED in FIG. 1, and the pixel circuit part of the pixel in the embodiment of FIG. 1 includes a first transistor (hereinafter, also referred to as a driving transistor) T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, a first hold capacitor Chold1, and a second hold capacitor Chold2. In addition, a first scan line to which a first scan signal GW(N) is applied, a second scan line to which a second scan signal GC(N) is applied, a third scan line to which a third scan signal GI(N) is applied, a fourth scan line to which a fourth scan signal EB(N) is applied, a first light-emitting signal line to which a first light-emitting control signal EM1(N) is applied, a second light-emitting signal line to which a second light-emitting control signal EM2(N) is applied, and a data line to which a data voltage $V_{DATA}$ is applied, may be connected to the pixel circuit part. In addition, the pixel may be applied with a high driving voltage ELVDD (hereinafter also referred to as a driving voltage or a first driving voltage), a low driving voltage ELVSS (hereinafter also referred to as a second driving voltage), a first initialization voltage $V_{INT}$, a second initialization voltage $V_{AINT}$, a reference voltage $V_{REF}$, and a bias voltage $V_{bias}$.

A structure of the pixel will now be described focusing on respective elements (the transistors, the capacitor, the light-emitting diode LED) included in the pixel as follows.

The driving transistor T1 includes a gate electrode (hereinafter also referred to as a driving gate electrode) connected to a first electrode of the storage capacitor Cst, a first electrode (input-side electrode) connected to a driving voltage ELVDD, and a second electrode (output-side electrode) that outputs a current according to a voltage of the gate electrode of the driving transistor T1.

The gate electrode of the driving transistor T1 is connected to a second electrode (output-side electrode) of the third transistor T3 and a second electrode (output-side electrode) of the fourth transistor T4. The first electrode of the driving transistor T1 is connected to a second electrode (output-side electrode) of the eighth transistor T8 and a second electrode (output-side electrode) of the ninth transistor T9. The second electrode of the driving transistor T1 is connected to a first electrode (input-side electrode) of the third transistor T3 and a first electrode (input-side electrode) of the sixth transistor T6. An output current of the driving transistor T1 is transmitted to the light-emitting diode LED through the sixth transistor T6 so that the light-emitting diode LED emits light. Luminance of light emitted by the light-emitting diode LED is determined according to an amount of the output current of the driving transistor T1.

The second transistor T2 (hereinafter also referred to as a switching transistor) includes a gate electrode connected to the first scan line to which the first scan signal GW(N) is applied, a first electrode (input-side electrode) connected to the data line to which the data voltage $V_{DATA}$ is applied, and a second electrode (output-side electrode) connected to a second electrode of the storage capacitor Cst. The second transistor T2 may apply the data voltage $V_{DATA}$ to the pixel and be stored in the storage capacitor Cst according to the first scan signal GW(N). The second electrode of the second transistor T2 is also connected to a second electrode (output-side electrode) of the fifth transistor T5, and is also connected to a first electrode of the first hold capacitor Chold1 and a first electrode of the second hold capacitor Chold2.

The storage capacitor Cst (hereafter also referred to as a voltage transmitting capacitor) includes the first electrode connected to the gate electrode of the driving transistor T1, and the second electrode connected to the second electrode of the second transistor T2, the second electrode of the fifth transistor T5, the first electrode of the first hold capacitor Chold1, and the first electrode of the second hold capacitor Chold2. The storage capacitor Cst may receive the data voltage $V_{DATA}$ outputted from the second transistor T2 to maintain the data voltage $V_{DATA}$ as the voltage of the gate electrode of the driving transistor T1. In the pixel of the illustrated embodiment, the data voltage $V_{DATA}$ is not directly transmitted to the gate electrode of the driving transistor T1 but is transmitted thereto through the storage capacitor Cst. This is a method of indirectly transmitting the data voltage $V_{DATA}$ to the gate electrode of the driving transistor T1 by a fact that, when the voltage of the second electrode of the storage capacitor Cst suddenly rises, the voltage of the first electrode, which is the other electrode thereof, also rises. According to this method, even when leakage occurs in the second transistor T2, the voltage of the gate electrode of the driving transistor T1 does not directly leak. In addition, in the illustrated embodiment, the data voltage $V_{DATA}$ passes through the storage capacitor Cst without passing through the other electrode of the driving transistor T1 to be directly transmitted to the gate electrode of the driving transistor T1, so that even when there is a difference in the driving voltage ELVDD according to the position of the pixel, the voltage stored in the storage capacitor Cst may be determined without affecting the difference in the driving voltage ELVDD.

The first hold capacitor Chold1 includes the first electrode connected to the second electrode of the storage capacitor Cst, and a second electrode to which the driving voltage ELVDD is applied. The first electrode of the first hold capacitor Chold1 is additionally connected to the second electrode of the second transistor T2 and the second electrode of the fifth transistor T5, and is also connected to the first electrode of the second hold capacitor Chold2.

The second hold capacitor Chold2 includes the first electrode connected to the second electrode of the storage capacitor Cst, and a second electrode to which the driving voltage ELVDD is applied. The first electrode of the second hold capacitor Chold2 is additionally connected to the second electrode of the second transistor T2 and the second electrode of the fifth transistor T5. In addition, the first electrode of the second hold capacitor Chold2 is also connected to the first electrode of the first hold capacitor Chold1.

As described above, the first hold capacitor Chold1 and the second hold capacitor Chold2 have a parallel-connection structure, and have the same connection relationship in terms of circuitry, so that each of the first and second electrodes receives the same voltage. However, referring to FIG. 7 to FIG. 17, layers that are actually formed or provided may have different structures, which will be described later.

According to the first hold capacitor Chold1 and the second hold capacitor Chold2, the voltage of the second electrode of the storage capacitor Cst is held without being changed even when a surrounding signal is changed so that it may have a constant voltage. Particularly, in the illustrated embodiment, since the two hold capacitors Chold1 and Chold2 are formed or provided in parallel and have a relatively large capacitance, the structure including the two hold capacitors Chold1 and Chold2 may have the merit of further reducing variability of the voltage of the second electrode of the storage capacitor Cst.

The third transistor T3 (hereinafter also referred to as a compensation transistor) includes a gate electrode connected to the second scan line to which the second scan signal GC(N) is applied, a first electrode (input-side electrode) connected to the second electrode of the driving transistor T1, and a second electrode (output-side electrode) connected to the first electrode of the storage capacitor Cst. The third transistor T3 defines a compensation path for compensating the threshold voltage of the driving transistor T1, so that the threshold voltage of the driving transistor T1 may be transmitted to the first electrode of the storage capacitor Cst and is compensated. As a result, even when the threshold voltages of the driving transistors T1 included in respective pixels are different, the driving transistor T1 may output a constant output current according to the applied data voltage $V_{DATA}$. A second electrode of the third transistor T3 is also connected to the second electrode of the fourth transistor T4.

The fourth transistor T4 (hereinafter also referred to as a gate initialization transistor) includes a gate electrode connected to a third scan line to which the third scan signal GI(N) is applied, a first electrode to which the first initialization voltage $V_{INT}$ is applied, and a second electrode connected to the first electrode of the storage capacitor Cst (or the gate electrode of the driving transistor T1 or the second electrode of the third transistor T3). The fourth transistor T4 may initialize a voltage of the first electrode of the storage capacitor Cst and the gate electrode of the driving transistor T1 to the first initialization voltage $V_{INT}$.

The fifth transistor T5 (hereafter referred to as a capacitor initialization transistor) includes a gate electrode connected to a second scan line to which the second scan signal GC(N) is applied, a first electrode to which the reference voltage VREF is applied, and a second electrode connected to the second electrode of the storage capacitor Cst, the first electrode of the first hold capacitor Chold1, the first electrode of the second hold capacitor Chold2, and the second electrode of the second transistor T2. The fifth transistor T5 may change a voltage of the second electrode of the storage capacitor Cst, the first electrode of the first hold capacitor Chold1, and the first electrode of the second hold capacitor Chold2 to the reference voltage $V_{REF}$ to initialize the voltage applied thereto.

The sixth transistor T6 (hereinafter also referred to as a current transmitting transistor) includes a gate electrode connected to a second light-emitting signal line to which the second light-emitting control signal EM2(N) is applied, a first electrode (input-side electrode) connected to the second electrode of the driving transistor T1, and a second electrode (output-side electrode) connected to a first electrode, e.g., an anode electrode, of the light-emitting diode LED. Here, the first electrode of the sixth transistor T6 is also connected to the first electrode of the third transistor T3, and the second electrode of the sixth transistor T6 is also connected to the second electrode of the seventh transistor T7. The sixth transistor T6 may transmit or block the output current of the driving transistor T1 to the light-emitting diode LED based on the second light-emitting control signal EM2(N).

The seventh transistor T7 (hereinafter also referred to as an anode initialization transistor) includes a gate electrode connected to a fourth scan line to which the fourth scan signal EB(N) is applied, a first electrode to which the second initialization voltage VAINT is applied, and a second electrode connected to the anode electrode of the light-emitting diode LED. The second electrode of the seventh transistor T7 is also connected to the second electrode of the sixth transistor T6. The seventh transistor T7 may initialize a voltage of the anode of the light-emitting diode LED to a second initialization voltage $V_{AINT}$.

The eighth transistor T8 (hereinafter also referred to as a bias transistor) includes a gate electrode connected to a fourth scan line to which the fourth scan signal EB(N) is applied, a first electrode to which the bias voltage Vbias is applied, and a second electrode connected to the first electrode of the driving transistor T1. The second electrode of the eighth transistor T8 is also connected to the second electrode of the ninth transistor T9. The eighth transistor T8 maintains the bias of the first electrode of the driving transistor T1 at the bias voltage Vbias so that the bias of the driving transistor T1 is not changed even when being driven at a low frequency, so the driving transistor T1 may output a constant output current.

The ninth transistor T9 (hereinafter also referred to as a driving voltage transmitting transistor) includes a gate electrode connected to a first light-emitting signal line to which the first light-emitting control signal EM1(N) is applied, a first electrode (input-side electrode) to which the driving voltage ELVDD is applied, and a second electrode (output-side electrode) connected to the first electrode of the driving transistor T1. The second electrode of the ninth transistor T9 is also connected to the second electrode of the eighth transistor T8. The ninth transistor T9 may transmit the driving voltage ELVDD to the driving transistor T1 based on the first light-emitting control signal EM1(N).

In the embodiment of FIG. 1, all of the transistors may be formed or provided by a polycrystalline semiconductor, and may be doped with doping particles of the same type, so that the transistors may be turned on when a low voltage is applied thereto and turned off when a high voltage is applied thereto. As a result, a gate-on voltage is a high-level voltage, and a gate-off voltage is a low-level voltage. Such transistor characteristics are the basis for analyzing the waveform diagram of FIG. 2.

The light-emitting diode LED includes the anode electrode connected to the second electrode of the sixth transistor T6 and a second electrode, e.g., a cathode electrode, connected to a low driving voltage ELVSS. The light-emitting diode LED may be connected between the pixel circuit part and the low driving voltage ELVSS to emit light with a luminance corresponding to a current supplied from the pixel circuit part (more specifically, the driving transistor T1). The light-emitting diode LED may include a light-emitting layer including at least one of an organic light-emitting material and an inorganic light-emitting material. Holes and electrons are respectively injected into the light-emitting layer from the anode and cathode electrodes, and light is emitted when excitons in which the injected holes and electrons are combined enter a ground state from an excited state. The light-emitting diode LED may emit light of one of the primary colors or white light. In an embodiment, the primary colors may include three primary colors such as red, green, and blue. In another embodiment, the primary colors may include three primary colors such as yellow, cyan, and magenta. According to the embodiment, it is possible to improve a color display characteristic by further including an additional color filter or color conversion layer.

In FIG. 1, since the equivalent capacitor viewed from the gate electrode of the driving transistor T1 has a structure in which the first hold capacitor Chold1 and the second hold capacitor Chold2 connected in parallel to the storage capacitor Cst are connected in series, when the capacitance (hereinafter also referred to as equivalent capacitance or converted capacitance) of the equivalent capacitor is calculated, it may have the value of Equation 1 below.

The converted capacitance=$C1 \times \{(C2+C3)/(C1+C2+C3)\}$ [Equation 1]

In Equation 1, C1 represents a capacitance of the storage capacitor Cst, C2 represents a capacitance of the first hold capacitor Chold1, and C3 represents a capacitance of the second hold capacitor Chold2.

In Equation 1, the converted capacitance value has a larger value when the value of C3 exists, that is, when the second hold capacitor Chold2 is formed or provided, than when the value of C3 is 0, that is, when the second hold capacitor Chold2 is not formed or provided. Therefore, the pixel having the circuit diagram of FIG. 1 has an advantage that the gate voltage of the driving transistor T1 is less influenced by the surroundings. As such, the gate voltage of the driving transistor T1 may be well maintained, so that a luminance difference that may occur in a high gray level when being driven at a low frequency may be reduced, and crosstalk may be eliminated or power consumption may be reduced when being driven at a high frequency.

In addition, since the eighth transistor T8 is included, the bias voltage Vbias is periodically applied to the driving transistor T1 so that the bias of the driving transistor T1 is not changed when being driven at a low frequency, so that the display luminance when being driven at the low frequency is maintained to be constant.

Figure 2:
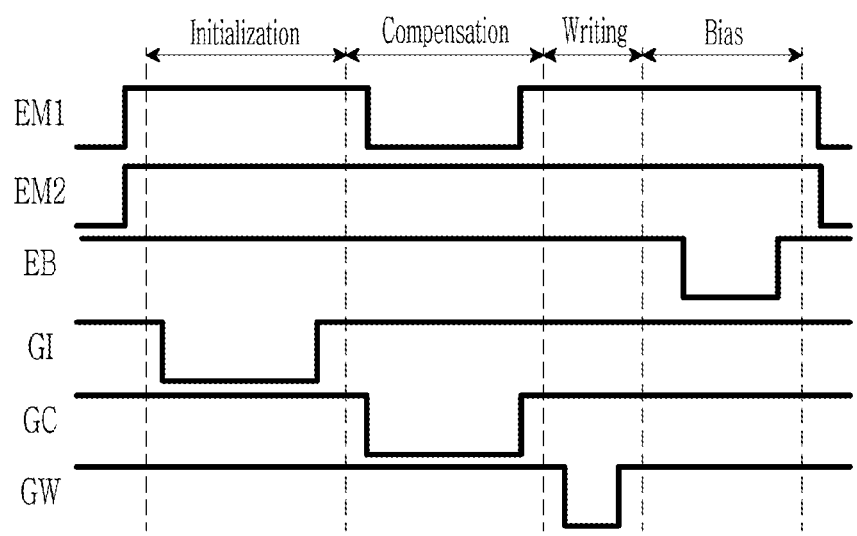
FIG. 2 illustrates a waveform diagram of a signal applied to the pixel of FIG. 1.

Hereinafter, an operation of the pixel when a waveform signal of FIG. 2 is applied to the pixel of FIG. 1 will be described with reference to FIG. 3 to FIG. 6.

FIG. 2 illustrates a waveform diagram of a signal applied to the pixel of FIG. 1, and FIG. 3 to FIG. 6 illustrate operations of respective periods of the waveform diagram of FIG. 2.

Referring to FIG. 2, when a signal applied to a pixel is divided into periods, the periods are divided into an initialization period, a compensation period, a writing period, and a bias period, and additionally, a period in which the first light-emitting control signal EM1(N) and the second light-emitting control signal EM2(N) have a low voltage is also referred to as a light-emitting period.

First, the light-emitting period is a period in which the light-emitting diode LED emits light, and in this case, a first light-emitting signal EM1 and a second light-emitting signal EM2 of a gate-on voltage (a low-level voltage) are applied to the ninth transistor T9 and the sixth transistor T6 to be turned on. When the ninth transistor T9 is turned on and the driving voltage ELVDD is transmitted to the driving transistor T1, an output current is generated according to the voltage of the gate electrode of the driving transistor T1. The output current of the driving transistor T1 is transmitted to the light-emitting diode LED through the turned-on sixth transistor T6 so that the light-emitting diode LED emits light. In FIG. 2, although the light-emitting period in which the first light-emitting signal EM1 and the second light-emitting signal EM2 apply the gate-on voltage (a low-level voltage) is hardly illustrated, the light-emitting period actually has the longest time. However, in the light-emitting period, only the above-described simple operation is performed, so since there is nothing to specifically explain, it is simply illustrated in FIG. 2.

When the light-emitting period ends, the initialization period is entered.

The light-emitting period ends when the first light-emitting signal EM1 and the second light-emitting signal EM2 are changed to gate-off voltages (high level voltages). The period in which the gate-off voltages of the first light-emitting signal EM1 and the second light-emitting signal EM2 are applied includes an initialization period, a compensation period, a writing period, and a bias period.

Figure 3:
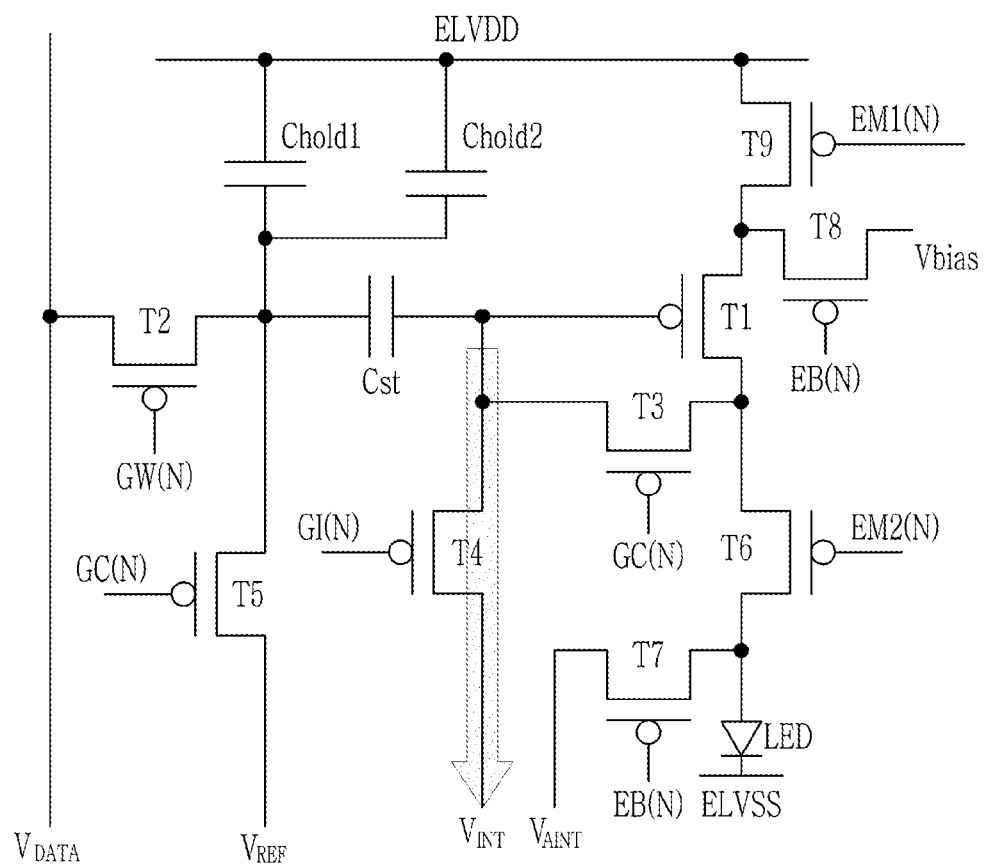
FIG. 3 to FIG. 6 illustrate operations of respective sections of the waveform diagram of FIG. 2.

The initialization period is a period in which the third scan signal GI(N) is changed to a gate-on voltage (low level voltage), and an operation of the initialization period is shown in FIG. 3.

Referring to FIG. 3, in the initialization period, the fourth transistor T4 to which the third scan signal GI(N) is applied is turned on so that a voltage of a portion (the first electrode of the storage capacitor Cst, the gate electrode of the driving transistor T1, and the second electrode of the third transistor T3) connected to the second electrode of the fourth transistor T4 is changed to the first initialization voltage $V_{INT}$ to initialize the voltage of the portion. In FIG. 3, an arrow direction is shown from the second electrode to the first electrode of the fourth transistor T4, which is, in the illustrated embodiment, because the first initialization voltage $V_{INT}$ is lower than a voltage of a portion (the first electrode of the storage capacitor Cst, the gate electrode of the driving transistor T1, and the second electrode of the third transistor T3) connected to the second electrode of the fourth transistor T4 so that a current may flow in the arrow direction. In the illustrated embodiment, the first initialization voltage $V_{INT}$ may be a low voltage that may turn on the driving transistor T1. As a result, the driving transistor T1 may have a turned-on state while passing through the initialization period. In some cases, the current direction may be opposite to the arrow direction shown in FIG. 3.

When the initialization period ends, the compensation period is entered.

Figure 4:
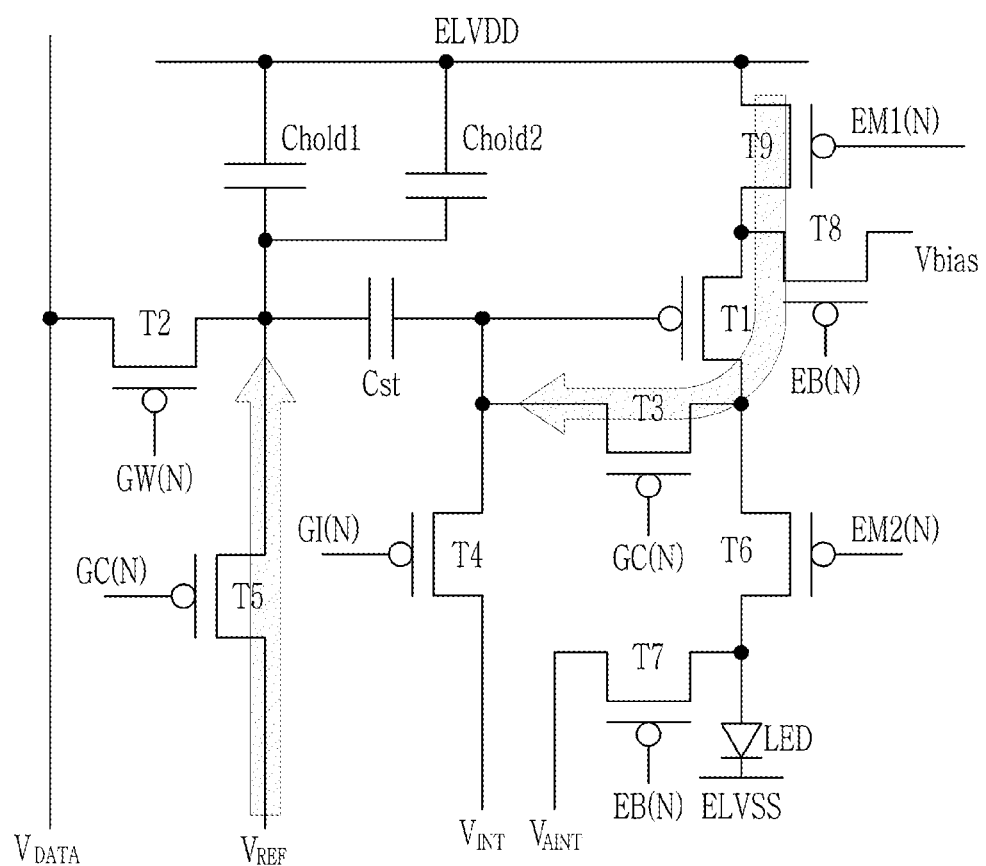

The initialization period ends as the third scan signal GI(N) is changed to the gate-off voltage (high level voltage), and then the second scan signal GC(N) is changed to the gate-on voltage (low level voltage) to become the compensation period. In this case, the first light-emitting control signal EM1(N) is also changed to a gate-on voltage (low level voltage). FIG. 4 illustrates an operation of the compensation period.

Referring to FIG. 4, in the compensation period, the third transistor T3 and the fifth transistor T5 to which the second scan signal GC(N) is applied are turned on, and the ninth transistor T9 to which the first light-emitting control signal EM1(N) is applied is also turned on.

First, the fifth transistor T5 is turned on so that a voltage of a portion (the second electrode of the storage capacitor Cst, the first electrode of the first hold capacitor Chold1, the first electrode of the second hold capacitor Chold2, and the second electrode of the second transistor T2) connected to the second electrode of the fifth transistor T5 is changed to the reference voltage $V_{REF}$. Due to the reference voltage VREF, a voltage at one end of each capacitor (the second electrode of the storage capacitor Cst, the first electrode of the first hold capacitor Chold1, and the first electrode of the second hold capacitor Chold2) becomes constant.

The ninth transistor T9 is turned on to transmit the driving voltage ELVDD to the driving transistor T1, and the third transistor T3 is turned on to form a structure (diode-connection structure) in which the second electrode and the gate electrode of the driving transistor T1 are connected with each other. In the initialization period, since the driving transistor T1 is turned on due to the first initialization voltage $V_{INT}$, the driving voltage ELVDD is inputted to the first electrode of the driving transistor T1 but is outputted to the second electrode of the driving transistor T1 and passes through the third transistor T3 to be transmitted to the gate electrode of the driving transistor T1 (the first electrode of the storage capacitor Cst).

As a result, the first initialization voltage $V_{INT}$ gradually increases, but the voltage of the gate electrode of the driving transistor T1 turns off the driving transistor T1 at the threshold voltage value of the driving transistor T1 so that the driving voltage ELVDD does not flow to the gate electrode of the driving transistor T1. Therefore, the voltage of the gate electrode of the driving transistor T1 has the threshold voltage of the driving transistor T1.

After the compensation period as described above, the second electrode of the storage capacitor Cst has the reference voltage $V_{REF}$, and the first electrode thereof has the threshold voltage of the driving transistor T1.

A direction of an arrow of FIG. 4 may indicate a direction of a current, and in some cases, the direction may be reversed.

When the compensation period ends, the writing period is entered.

As the second scan signal GC(N) and the first light-emitting control signal EM1(N) are changed to the gate-off voltages (high level voltages), the compensation period ends, and then the first scan signal GW(N) is changed to the gate-on voltage (low level voltage) to become the writing period. An operation of the writing period is illustrated in FIG. 5.

Figure 5:
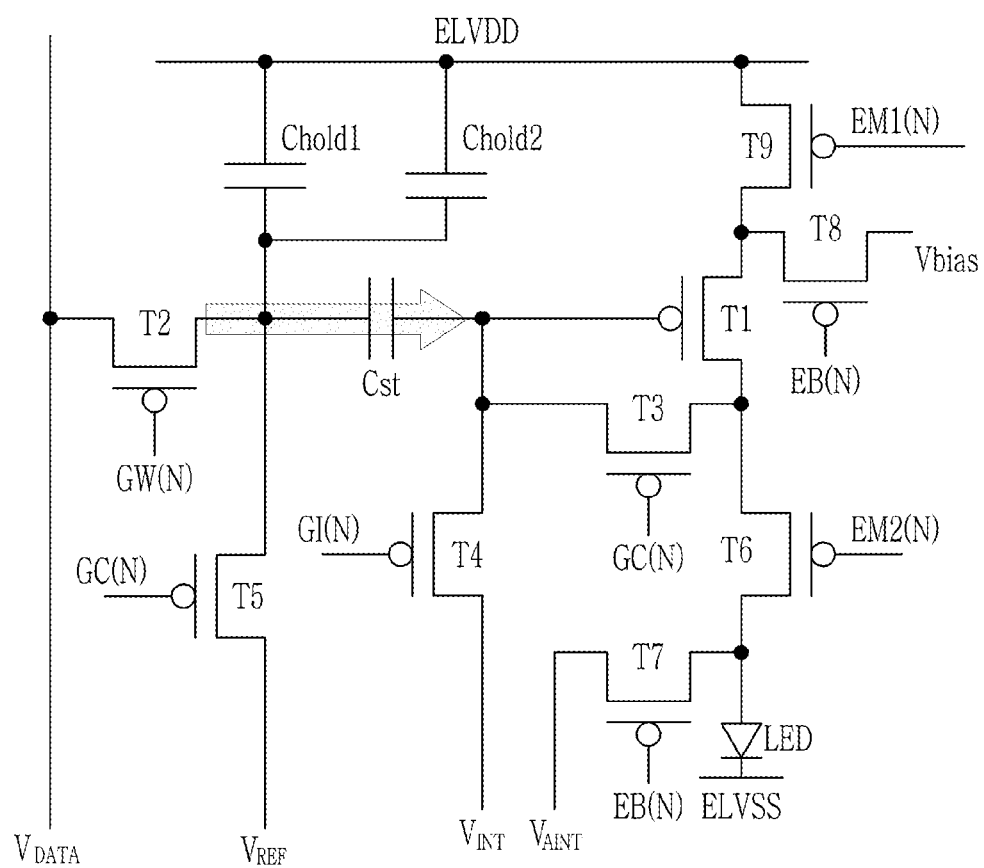

Referring to FIG. 5, in the writing period, the second transistor T2 to which the first scan signal GW(N) is applied is turned on, so that the data voltage $V_{DATA}$ is inputted to the first electrode of the second transistor T2 and outputted to the second electrode thereof, and thus a voltage of a portion (the second electrode of the storage capacitor Cst, the first electrode of the first hold capacitor Chold1, the first electrode of the second hold capacitor Chold2, and the second electrode of the fifth transistor T5) connected to the second electrode of the second transistor T2 is changed to the data voltage $V_{DATA}$.

In this case, an operation of the storage capacitor Cst is as follows.

The second electrode of the storage capacitor Cst is maintained as the reference voltage $V_{REF}$ while passing through the compensation period, and then is changed to the data voltage $V_{DATA}$. In this case, a voltage value of the first electrode of the storage capacitor Cst is changed in proportion to a voltage changing amount of the second electrode of the storage capacitor Cst. That is, since the voltage changing amount of the second electrode of the storage capacitor Cst is a voltage difference between the data voltage $V_{DATA}$ and the reference voltage $V_{REF}$, the voltage of the first electrode of the storage capacitor Cst is additionally changed by a value that is proportional to the voltage difference between the data voltage $V_{DATA}$ and the reference voltage $V_{REF}$ at the threshold voltage. In this case, the voltage value of the first electrode of the storage capacitor Cst may be lowered. Since the voltage value of the first electrode of the storage capacitor Cst is the same as the voltage value of the gate electrode of the driving transistor T1, a degree to which the driving transistor T1 is turned on during the light-emitting period is determined by the lowered voltage value of the gate electrode of the driving transistor T1, and an amount of the output current is determined.

In FIG. 2, the writing period may proceed for 1 H, which indicates one horizontal period, and the 1 horizontal period may correspond to one horizontal synchronization signal Hsync. In an embodiment, the horizontal period 1 H may mean a time period when the gate-on voltage is applied to a scan line of a next row after the gate-on voltage is applied to one scan line. Referring to FIG. 2, it may be seen that the initialization period, the compensation period, the bias period, and the light-emitting period are longer than the writing period of 1 H, and in some embodiments, the compensation period may have a time of 3H or more so that the threshold voltage of the driving transistor T1 may be sufficiently compensated. That is, when the pixel separates the compensation period for compensating the threshold voltage of the driving transistor T1 and the writing period for writing the data voltage $V_{DATA}$, and makes the compensation time three times longer than the writing section 1H to perform high-speed driving, even when the time of 1H is very short, a time of 3H or more is secured so that the compensation time is not insufficient, so that sufficient compensation may be provided during the high-speed driving.

In addition, in the writing period, the voltage of the first electrode of the storage capacitor Cst, that is, the voltage of the gate electrode of the driving transistor T1, is changed by a value proportional to the voltage difference between the data voltage $V_{DATA}$ and the reference voltage $V_{REF}$ at the threshold voltage of the driving transistor T1, so that it has a voltage value independent of the driving voltage ELVDD. Therefore, even when the driving voltage ELVDD is not constant according to the position of the pixel, the voltage of the gate electrode of the driving transistor T1 of the pixel is not or little affected, so that the display luminance is not changed. Accordingly, even when the driving voltage ELVDD varies according to a position thereof, each pixel may display a constant luminance.

A direction of an arrow in FIG. 5 may indicate a direction in which the data voltage $V_{DATA}$ is applied, and may have an opposite direction when viewed in a direction of a current.

When the writing period ends, the bias period is entered.

The compensation period ends as the first scan signal GW(N) is changed to the gate-off voltage (high level voltage), and then, the fourth scan signal EB(N) is changed to the gate-on voltage (low level voltage) to become the bias period. An operation of the bias period is illustrated in FIG. 6.

Figure 6:
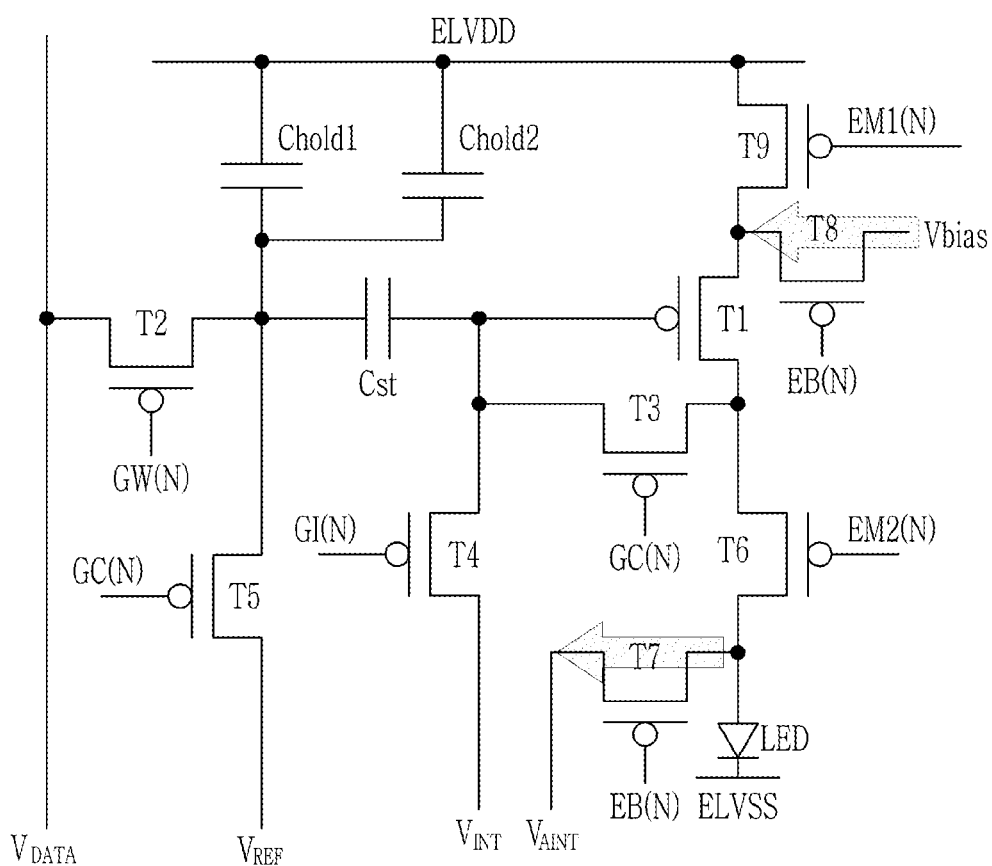

Referring to FIG. 6, the seventh transistor T7 and the eighth transistor T8 to which the fourth scan signal EB(N) is applied are turned on in the bias period.

First, the seventh transistor T7 is turned on so that a voltage of a portion (the anode of light-emitting diode LED and the second electrode of the sixth transistor T6) connected to the second electrode of the seventh transistor T7 is changed to the second initialization voltage $V_{AINT}$. Therefore, the bias period is also a period in which a voltage of the anode of the light-emitting diode LED is initialized, and thus may be also referred to as an anode initialization period.

The eighth transistor T8 is turned on so that a voltage of a portion (the first electrode of the driving transistor T1 and the second electrode of the ninth transistor T9) connected to the second electrode of the eighth transistor T8 is changed to the bias voltage Vbias.

The voltage of the first electrode of the driving transistor T1 is maintained at the bias voltage Vbias so that a voltage relationship of respective terminals of the driving transistor T1 is not changed and the driving transistor T1 generates a constant output current. Particularly, in the case of low-frequency driving, the driving transistor T1 is desired to generate an output current for a long time by the data voltage $V_{DATA}$ of one time inputted through the second transistor T2, but as time goes by, while the voltage relationship of respective terminals of the driving transistor T1 may be changed, the output current may be changed. However, by periodically applying the bias voltage Vbias, the voltage relationship of the driving transistor T1 is not changed, and the output current is maintained constant.

The bias voltage Vbias may have a constant voltage level, and may be set to a different voltage for each device according to the characteristics of the light-emitting display device.

A direction of an arrow of FIG. 6 may indicate a direction of a current, and in some cases, the direction may be reversed.

In the above, the circuit structure and operation of the pixel have been described. Hereinafter, a planar structure of a pixel circuit part of a pixel in an embodiment will be described in detail with reference to FIG. 7 to FIG. 14. That is, the light-emitting diode LED is not illustrated in FIG. 7 to FIG. 14 below, but a structure of the pixel circuit part disposed therebelow will be described.

FIG. 7 to FIG. 14 illustrate top plan views of an embodiment of respective layers according to a manufacturing sequence of a light-emitting display device.

Figure 7:
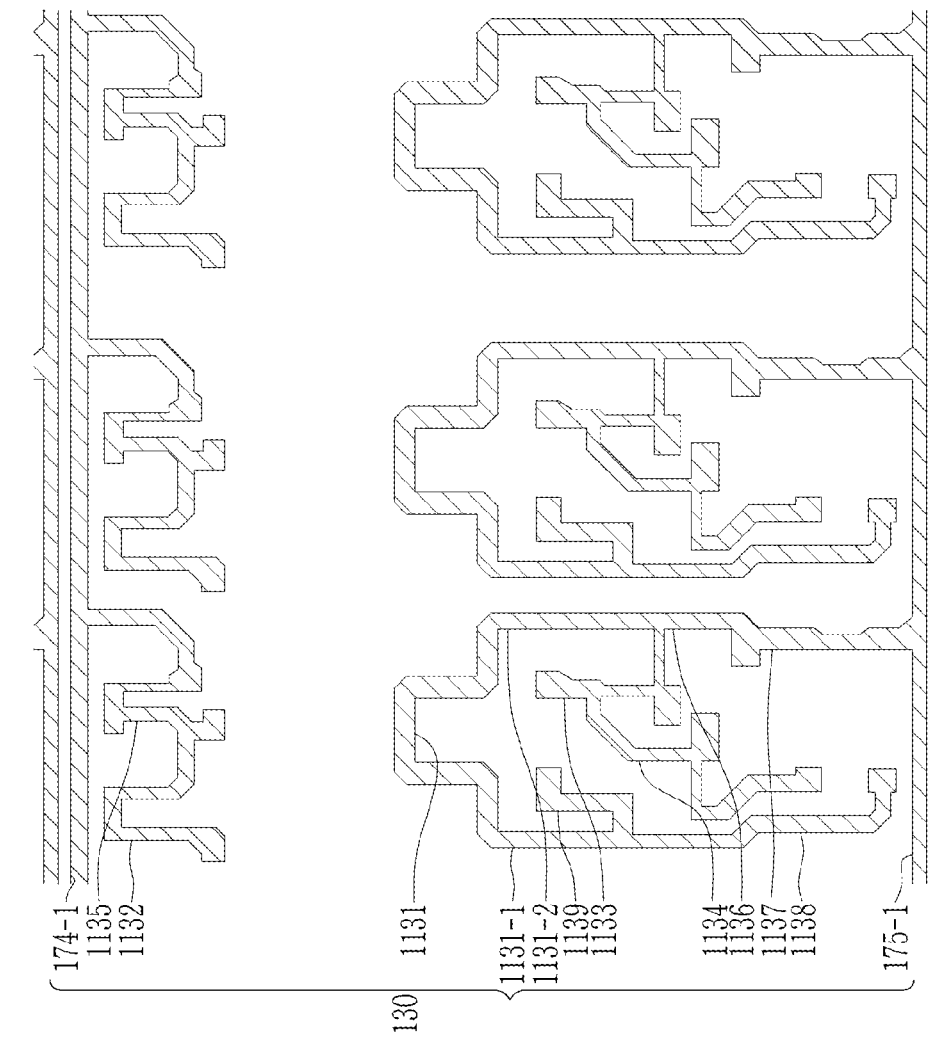
FIG. 7 to FIG. 14 illustrate top plan views of an embodiment of respective layers according to a manufacturing sequence of a light-emitting display device.
Figure 17:
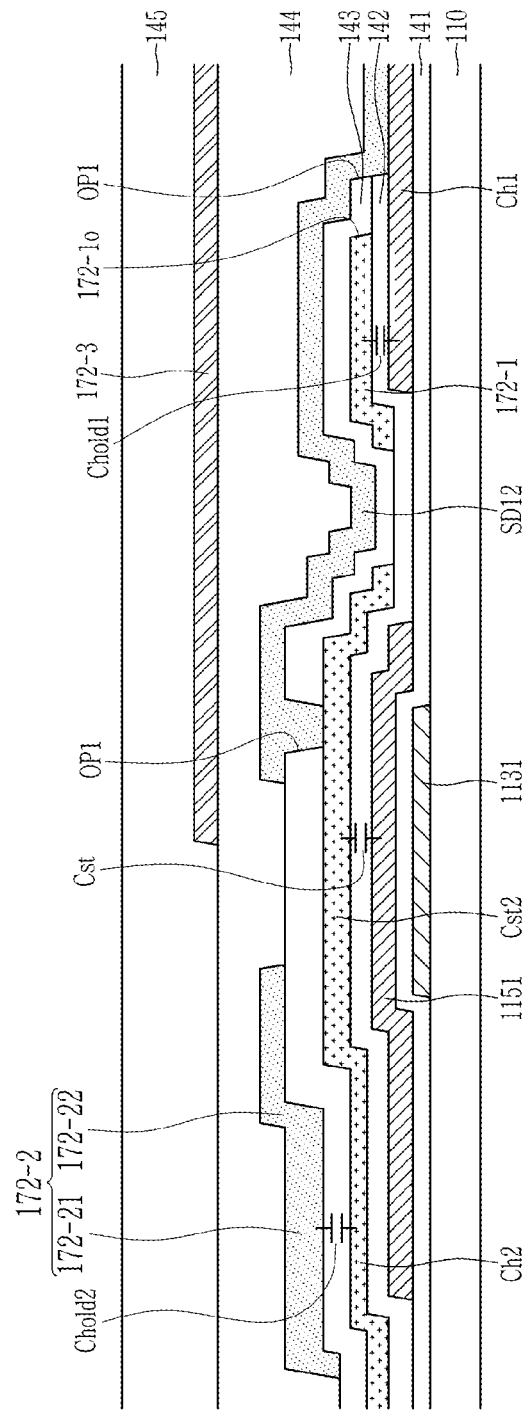
FIG. 17 illustrates a cross-sectional view taken along line XVII-XVII' of FIG. 15.

First, referring to FIG. 7, a semiconductor layer 130 is formed or disposed on a substrate (refer to 110 in FIG. 17).

Here, the substrate include a material that has a rigid characteristic such as glass and thus is not bent, or may include a flexible material such as plastic or polyimide that may be bent. In a case of a flexible substrate, a two-layered structure that has polyimide and a barrier layer including an inorganic insulating material thereon may have a double structure.

In an embodiment, the semiconductor layer 130 may include a silicon semiconductor (e.g., a polycrystalline semiconductor), and may include an oxide semiconductor or an amorphous semiconductor. A partial area of the semiconductor layer 130 may have the same or similar characteristics as characteristics of a conductor by plasma treatment or doping with impurities, so that electric charges may be transferred. A channel portion of the transistor in the semiconductor layer 130 may not be doped with impurities.

The semiconductor layer 130 includes semiconductors 1131, 1132, 1133, 1134, 1135, 1136, 1137, 1138, and 1139 included in each transistor, and additionally, includes a first reference voltage line 174-1 to which a reference voltage $V_{REF}$ is applied, and a (2-1)-th initialization voltage line 175-1 to which a second initialization voltage $V_{AINT}$ is applied. Among the semiconductor layer 130, the first reference voltage line 174-1 and the (2-1)-th initialization voltage line 175-1 extend in a first direction (hereinafter also referred to as a horizontal direction), and may be doped to have a characteristic similar to that of a conductor.

The driving transistor T1 includes a first semiconductor 1131, the second transistor T2 includes a second semiconductor 1132, the third transistor T3 includes a third semiconductor 1133, the fourth transistor T4 includes a fourth semiconductor 1134, the fifth transistor T5 includes a fifth semiconductor 1135, the sixth transistor T6 includes a sixth semiconductor 1136, the seventh transistor T7 includes a seventh semiconductor 1137, the eighth transistor T8 includes an eighth semiconductor 1138, and the ninth transistor T9 includes a ninth semiconductor 1139. In FIG. 7, the first semiconductor 1131 of the driving transistor T1 additionally includes a first area 1131-1 and a second area 1131-2, and the first area 1131-1 may correspond to the first electrode of the driving transistor T1, while the second area 1131-2 may correspond to the second electrode of the driving transistor T1. A channel area of the driving transistor T1 may be disposed between the first area 1131-1 and the second area 1131-2 of the first semiconductor 1131. Referring to FIG. 7, the first semiconductor 1131 of the driving transistor T1 has a bent structure and may have an omega (Ω) shape, and the first area 1131-1 extends to be connected to the eighth semiconductor 1138 and the ninth semiconductor 1139. The second area 1131-2 may extend to be connected to the third semiconductor 1133 and the sixth semiconductor 1136, the third semiconductor 1133 may further extend to be connected to the fourth semiconductor 1134, the sixth semiconductor 1136 may further extend to be connected to the seventh semiconductor 1137, and the seventh semiconductor 1137 may further extend to be connected to the (2-1)-th initialization voltage line 175-1.

Among the semiconductor layer 130, the second semiconductor 1132, the fifth semiconductor 1135, and the first reference voltage line 174-1 may be separated from the first semiconductor 1131 or the like. Referring to FIG. 7, the second semiconductor 1132 and the fifth semiconductor 1135 each have an n-shaped bent structure, and the second semiconductor 1132 and the fifth semiconductor 1135 may be connected to each other. The fifth semiconductor 1135 may extend to be connected to the first reference voltage line 174-1.

Each of the semiconductors 1132, 1133, 1134, 1135, 1136, 1137, 1138, and 1139 included in the second transistor T2 to the ninth transistor T9 may include a first area and a second area, and the first area may correspond to the first electrode, while the second area may correspond to the second electrode. A channel area of each transistor may be disposed between the first area and the second area.

Referring to FIG. 17, a first gate insulating film 141 may be disposed on the semiconductor layer 130. In an embodiment, the first gate insulating film 141 may be an inorganic insulating film including a silicon oxide (SiOx), a silicon nitride (SiNx), or a silicon oxynitride ($SiO_xN_y$).

Figure 8:
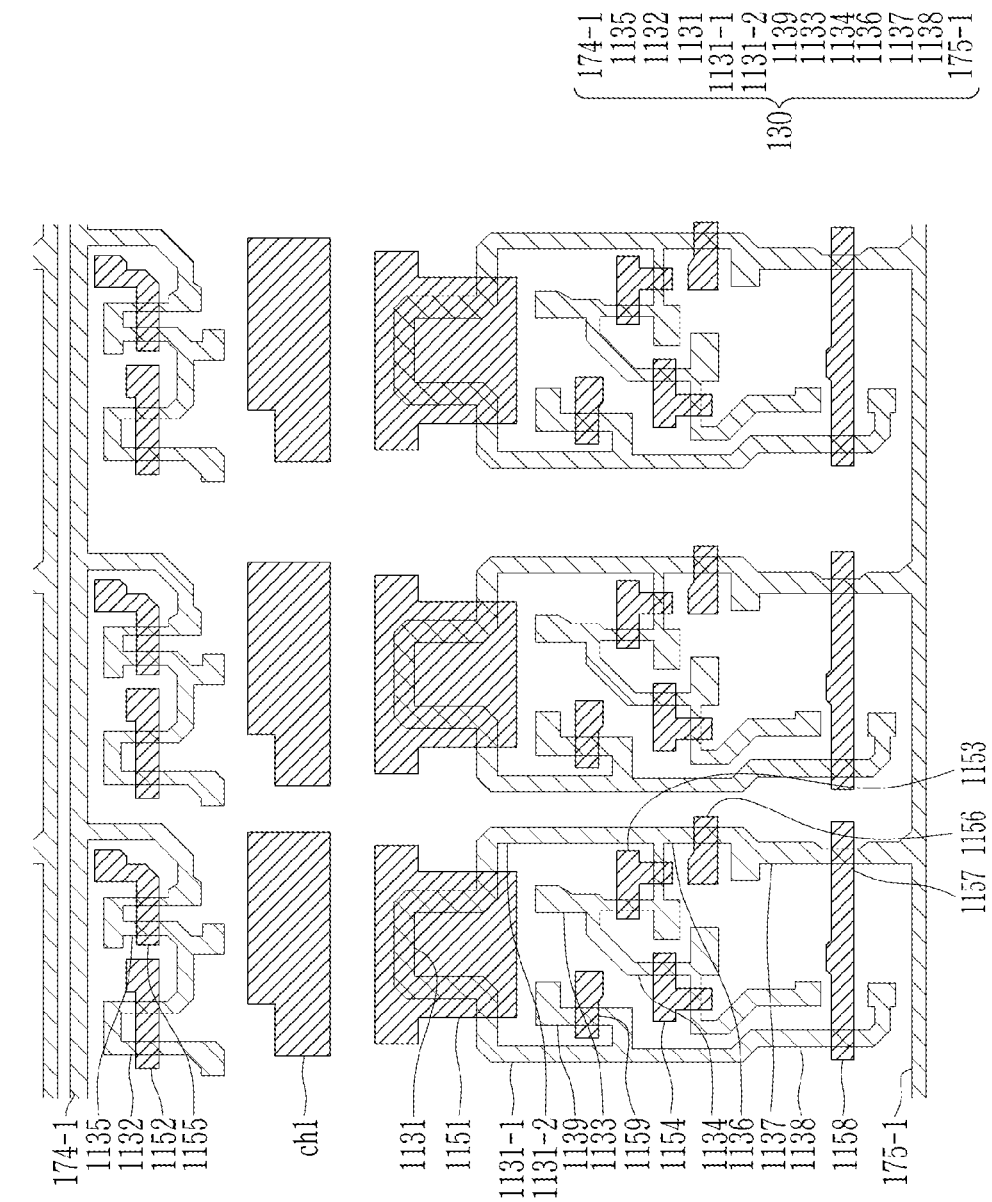

Referring to FIG. 8, a first gate conductive layer including a gate electrode 1151 (hereinafter also referred to as a driving gate electrode) of the driving transistor T1 may be disposed on the first gate insulating film 141. A gate electrode 1151 of the driving transistor T1 has a T-shape and includes a portion extending to the left and right.

The first gate conductive layer includes not only the gate electrode 1151 of the driving transistor T1 but also gate electrodes 1152, 1153, 1154, 1155, 1156, 1157, 1158, and 1159 of the second transistor T2 to the ninth transistor T9. That is, the second transistor T2 includes a second gate electrode 1152, the third transistor T3 includes a third gate electrode 1153, the fourth transistor T4 includes a fourth gate electrode 1154, the fifth transistor T5 includes a fifth gate electrode 1155, the sixth transistor T6 includes a sixth gate electrode 1156, the seventh transistor T7 includes a seventh gate electrode 1157, the eighth transistor T8 includes an eighth gate electrode 1158, and the ninth transistor T9 includes a ninth gate electrode 1159. Referring to FIG. 8, the seventh gate electrode 1157 and the eighth gate electrode 1158 are connected to each other and may extend in the first direction. In a portion of the semiconductor layer 130 that overlaps each gate electrode, a channel area of each transistor is disposed, and a first area and a second area are disposed on opposite sides thereof.

Additionally, the first gate conductive layer may also include a first electrode ch1 of the first hold capacitor Chold1. The first electrode ch1 of the first hold capacitor Chold1 is disposed in a portion in which the semiconductor layer 130 is not formed or provided.

In an embodiment, the first gate conductive layer may include a metal such as copper (Cu), molybdenum (Mo), aluminum (Al), or titanium (Ti), or any metal alloys thereof, and may be formed or provided as a single layer or a multilayer.

After the first gate conductive layer is formed or provided, a plasma treatment or doping process may be performed to make a portion of the semiconductor layer 130 not covered with the first gate conductive layer conductive. That is, the semiconductor layer 130 covered by the first gate conductive layer is not conductive, and the portion of the semiconductor layer 130 that is not covered by the first gate conductive layer may have the same characteristic as the conductive layer.

Referring to FIG. 17, a second gate insulating film 142 may be disposed on the first gate conductive layer and the first gate insulating film 141. In an embodiment, the second gate insulating film 142 may be an inorganic insulating film including a silicon oxide (SiOx), a silicon nitride (SiNx), or a silicon oxynitride ($SiO_xN_y$).

Figure 9:
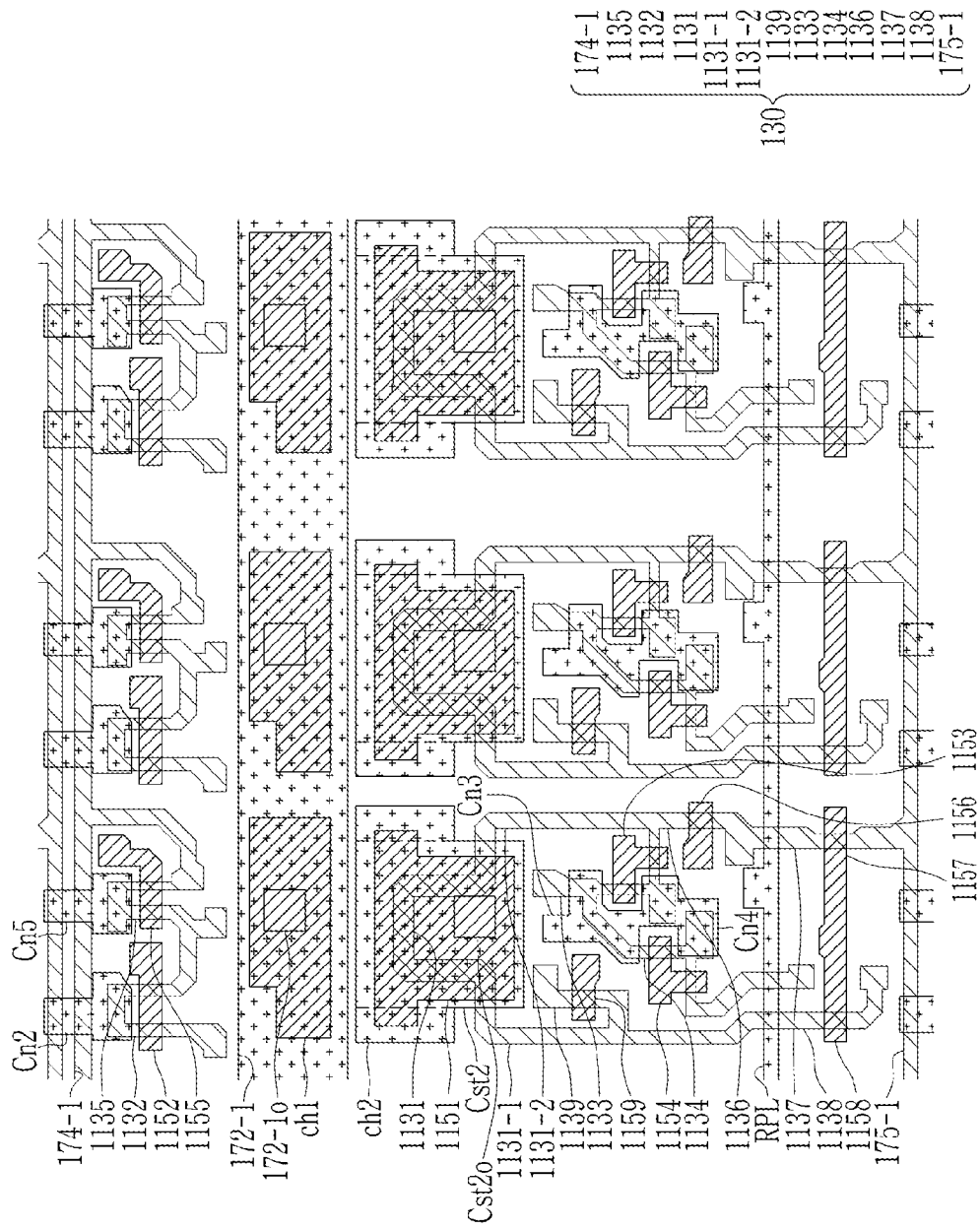

Referring to FIG. 9, a second gate conductive layer may be formed or disposed on the second gate insulating film 142.

The second gate conductive layer includes a first driving voltage line 172-1, a second electrode Cst2 of the storage capacitor Cst, and overlapping electrodes Cn2, Cn3, Cn4, and Cn5.

The first driving voltage line 172-1 is a wire that extends in the first direction and has a wide width to be able to overlap the first electrode ch1 of the first hold capacitor Chold1 in a plan view and through which the driving voltage ELVDD is transmitted. In addition, an opening 172-10 overlapping a portion of the first electrode ch1 of each first hold capacitor Chold1 is defined in the first driving voltage line 172-1. An opening (refer to FIG. 10) is also defined in the second gate insulating film 142 disposed between the first driving voltage line 172-1 and the first electrode ch1 of the first hold capacitor Chold1 in a plan view in a portion corresponding to the opening 172-10 of the first driving voltage line 172-1 so that the first electrode ch1 of the first hold capacitor Chold1 is exposed to an upper portion thereof to be able to be connected to an upper conductive layer. The first driving voltage line 172-1 overlapping the first electrode ch1 of the first hold capacitor Chold1 and the second gate insulating film 142 interposed therebetween configure the first hold capacitor Chold1 of FIG. 1, and a portion of the first driving voltage line 172-1 that overlaps the first electrode ch1 of the first hold capacitor Chold1 in a plan view corresponds to the second electrode of the first hold capacitor Chold1.

Like the gate electrode 1151 of the driving transistor T1, the second electrode Cst2 of the storage capacitor Cst has a T-shape to include a portion extending left and right, and it may have a larger T-shape than that of the gate electrode 1151. The portion extending to the left and right of the T-shape of the second electrode Cst2 of the storage capacitor Cst (the left and right portion of a dotted line in FIG. 9) is also referred to as a first additional electrode ch2 of the second hold capacitor Chold2. In addition, an opening Cst2o overlapping a portion of the gate electrode 1151 of the driving transistor T1 is defined in the second electrode Cst2 of the storage capacitor Cst. An opening (refer to FIG. 10) is also defined in the second gate insulating film 142 disposed between the second electrode Cst2 of the storage capacitor Cst and the gate electrode 1151 of the driving transistor T1 in a plan view in a portion corresponding to the opening Cst2o of the second electrode Cst2 of the storage capacitor Cst, so that the gate electrode 1151 of the driving transistor T1 is exposed to an upper portion thereof to be able to be connected to an upper conductive layer. The gate electrode 1151 of the driving transistor T1 overlapping the second electrode Cst2 of the storage capacitor Cst and the second gate insulating film 142 disposed therebetween configure the storage capacitor Cst of FIG. 1, and in this case, the gate electrode 1151 of the driving transistor T1 serves as both the gate electrode of the driving transistor T1 and the first electrode of the storage capacitor Cst.

The second electrode Cst2 of the storage capacitor Cst configures the second hold capacitor Chold2 of FIG. 1 while overlapping a second driving voltage line 172-2 of the first data conductive layer disposed thereon. That is, a portion of the second electrode Cst2 of the storage capacitor Cst also serves as the first electrode of the second hold capacitor Chold2. Particularly, the first additional electrode ch2 of the second hold capacitor Chold2, which is the portion extending left and right in the second electrodes Cst2 of the storage capacitor Cst, further increases capacitance of the second hold capacitor Chold2 while overlapping a vertical portion 172-21 and a shielding portion 172-23 of the second driving voltage line 172-2 to be described later in a plan view.

Each of the overlapping electrodes Cn2, Cn3, Cn4, and Cn5 forms an additional capacitor while overlapping a portion of the semiconductor layer 130. That is, the overlapping electrode Cn2 for the second transistor T2 overlaps a portion of the second semiconductor 1132 that does not overlap the second gate electrode 1152 to configure a corresponding semiconductor and an additional capacitor. The overlapping electrode Cn3 for the third transistor T3 overlaps a portion of the third semiconductor 1133 that does not overlap the third gate electrode 1153 to configure a corresponding semiconductor and an additional capacitor. The overlapping electrode Cn4 for the fourth transistor T4 overlaps a portion of the fourth semiconductor 1134 that does not overlap the fourth gate electrode 1154 to configure a corresponding semiconductor and an additional capacitor. The overlapping electrode Cn3 for the third transistor T3 and the overlapping electrode Cn4 for the fourth transistor T4 may be extended and unitary. The overlapping electrode Cn5 for the fifth transistor T5 overlaps a portion of the fifth semiconductor 1135 that does not overlap the fifth gate electrode 1155 to configure a corresponding semiconductor and an additional capacitor. The additional capacitors as described above are not shown in FIG. 1, and are omitted from FIG. 1 because they do not significantly affect the operation of the pixel. The additional capacitors as described above prevent the voltage characteristic of the semiconductor layer 130 overlapping respective overlapping electrodes Cn2, Cn3, Cn4, and Cn5 from being changed, and protect (shield) it from voltage fluctuations in other constituent elements.

The second gate conductive layer in the embodiment of FIG. 9 further includes a repair line RPL extending in the first direction. When there is a defect in the pixel, the second gate conductive layer may be short-circuited with a portion (e.g., a portion connected to the anode of the light-emitting diode LED by a conductive layer (SD14 in FIG. 11) disposed on an upper portion thereof) of the pixel by the repair line RPL to apply a constant current to the light-emitting diode to emit light.

In an embodiment, the second gate conductive layer may include a metal such as copper (Cu), molybdenum (Mo), aluminum (Al), titanium (Ti), or any metal alloys thereof, and may be formed or provided as a single layer or a multilayer.

Referring to FIG. 17, a first inter-insulating film 143 may be disposed on the second gate conductive layer. In an embodiment, the first inter-insulating film 143 may include an inorganic insulating film including a silicon oxide (SiOx), a silicon nitride (SiNx), or a silicon oxynitride ($SiO_xN_y$), and in some embodiments, the inorganic insulating material may be thickly formed or provided therein, or in some embodiments, the organic insulating material may be included.

Figure 10:
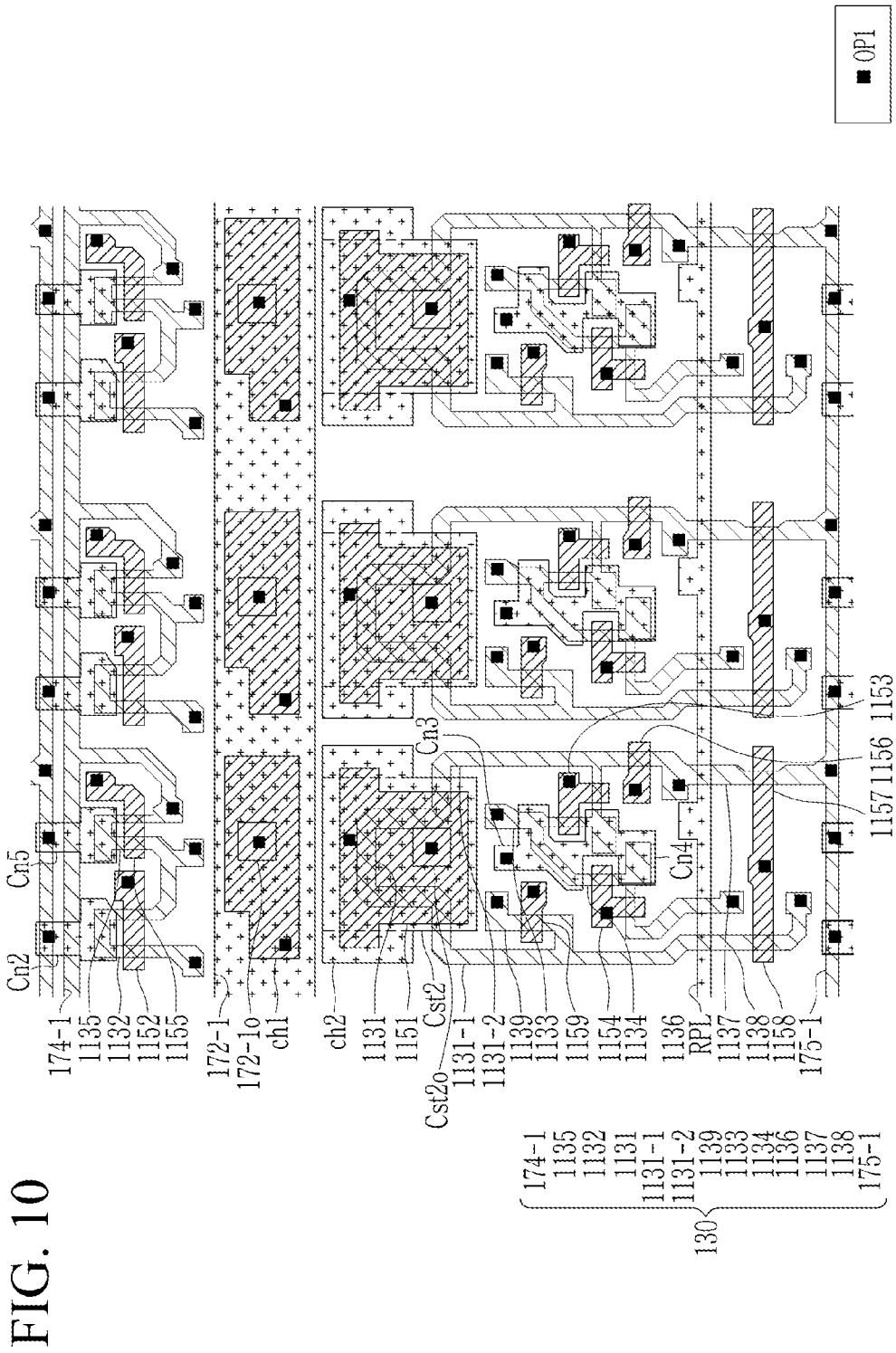

Referring to FIG. 10, an opening OP1 is defined in the first inter-insulating film 143.

The opening OP1 is defined in at least one of the first inter-insulating film 143, the second gate insulating film 142, and the first gate insulating film 141, and exposes an upper portion of the semiconductor layer 130, the first gate conductive layer, or the second gate conductive layer so as to be connected to the first data conductive layer disposed on the first inter-insulating film 143. Specifically, the opening OP1 overlapping only the semiconductor layer 130 among the openings OP1 of FIG. 10 is unitarily defined in the first inter-insulating film 143, the second gate insulating film 142, and the first gate insulating film 141 to expose the semiconductor layer 130. The openings OP1 overlapping only the semiconductor layer 130 and the first gate conductive film among the openings OP1 is unitarily defined in the first inter-insulating film 143 and the second gate insulating film 142 to expose the first gate conductive layer. The opening OP1 exposing the first gate conductive layer overlaps the openings 172-10 and Cst2o respectively disposed on the first driving voltage line 172-1 and the second electrode Cst2 of the storage capacitor Cst of the second gate conductive layer to expose a lower first gate conductive layer, that is, the first electrode ch1 of the first hold capacitor Chold1 and the gate electrode 1151 of the driving transistor T1. The opening OP1 overlapping the second gate conductive layer among the openings OP1 is defined in the first inter-insulating film 143 to expose the second gate conductive layer.

Figure 11:
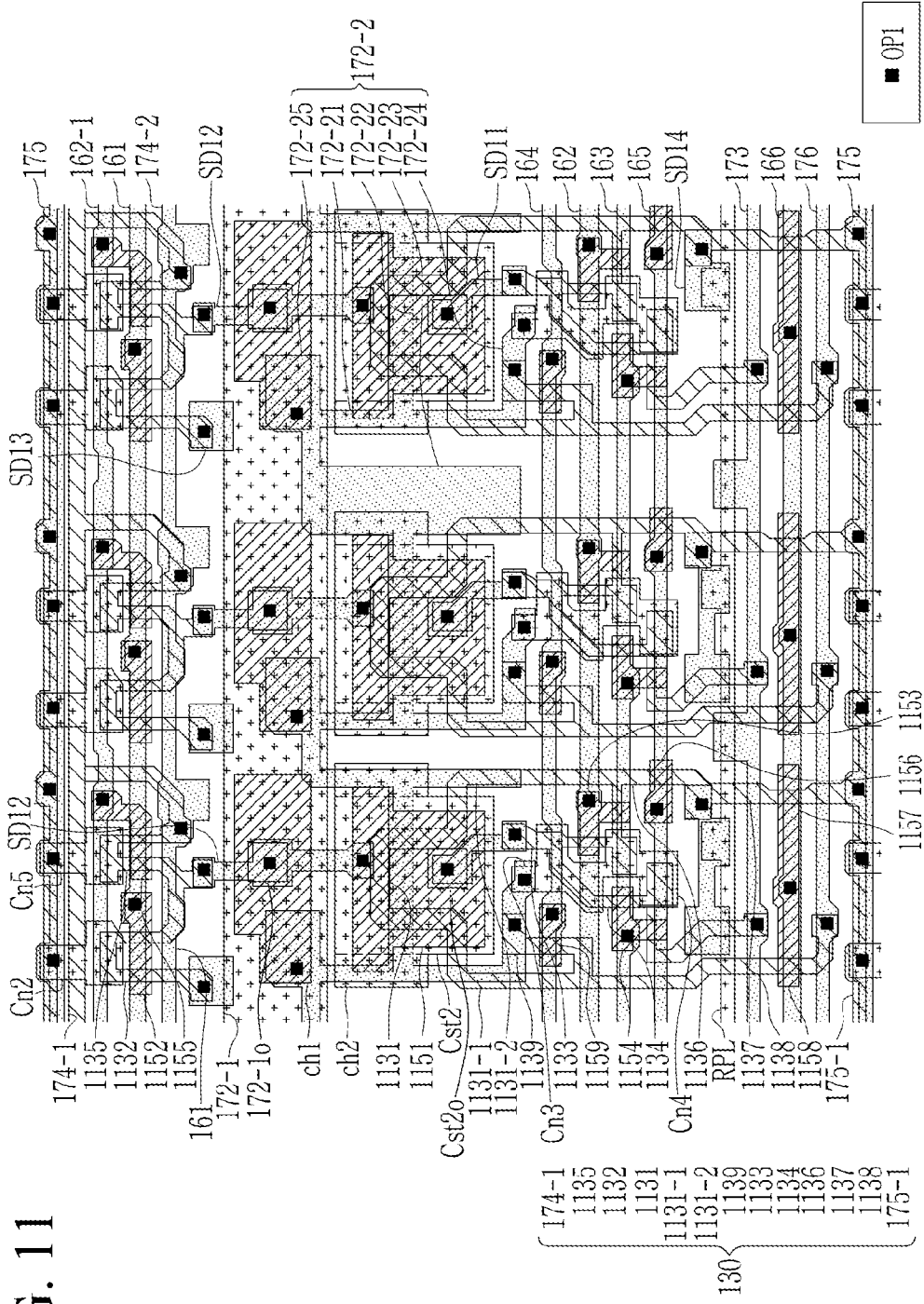

Referring to FIG. 11, a first data conductive layer may be disposed on the first inter-insulating film 143.

The first data conductive layer of FIG. 11 may include a voltage line to which a constant voltage is applied, and a signal line and a connecting member to which a signal (scan signal or light-emitting signal) that is changed for each frame may be inputted.

As voltage lines to which a constant voltage is applied in the first data conductive layer in FIG. 11, the second driving voltage line 172-2, a first initialization voltage line 173, a second reference voltage line 174-2, a second initialization voltage line 175, and a bias voltage line 176 may be included.

As signal lines to which a scan signal may be inputted for each frame in the first data conductive layers of FIG. 11, a first scan line 161 to which the first scan signal GW(N) is applied, second scan lines 162 and 162-1 to which the second scan signal GC(N) is applied, a third scan line 163 to which the third scan signal GI(N) is applied, a first light-emitting signal line 164 to which the first light-emitting control signal EM1(N) is applied, a second light-emitting signal line 165 to which the second light-emitting control signal EM2(N) is applied, and a fourth scan line 166 to which the fourth scan signal EB(N) is applied may be included.

The connecting member of the first data conductive layer of FIG. 11 may include a first connecting member SD11, a second connecting member SD12, a third connecting member SD13, and a fourth connecting member SD14.

First, the voltage line of the first data conductive layer will be described.

The second driving voltage line 172-2 (hereafter also referred to as a driving voltage line disposed in the first data conductive layer) is bent and extended in the first direction, and includes a vertical portion 172-21, a horizontal portion 172-22, a shielding portion 172-23, a connecting portion 172-24, and an extending portion 172-25.

The vertical portion 172-21 is extended in a direction perpendicular to the first direction (also referred to as a second direction or vertical direction), and opposite sides thereof are connected to the connecting portion 172-24 and the extending portion 172-25, and a middle portion thereof is connected to the horizontal portion 172-22. The horizontal portion 172-22 has a structure extending in the first direction from a middle portion of the vertical portion 172-21 to be connected to the shielding portion 172-23, and the shielding portion 172-23 extends in the second direction and overlaps a portion of the semiconductor layer 130 to shield the semiconductor layer 130 and extends to be connected to the extending portion 172-25 and the vertical portion 172-21. A portion of the shielding portion 172-23 may have an expanding structure to configure an extending shielding portion 172-23.

The vertical portion 172-21, the horizontal portion 172-22, and the shielding portion 172-23 of the second driving voltage line 172-2 may overlap the second electrode Cst2 of the storage capacitor Cst disposed in the second gate conductive layer in a plan view to configure the second hold capacitor Chold2 of FIG. 1, and serves as the second electrode of the second hold capacitor Chold2. Specifically, the horizontal portion 172-22 overlaps the second electrode Cst2 of the storage capacitor Cst, and the vertical portion 172-21 and the shielding portion 172-23 overlap a portion (the first additional electrode ch2 of the second hold capacitor Chold2) extending to the left and right of the second electrode Cst2 of the storage capacitor Cst to additionally form the second hold capacitor Chold2, thereby having a further large capacitance.

In addition, the vertical portion 172-21 and the shielding portion 172-23 of the second driving voltage line 172-2 extend in the second direction and overlap a portion of the semiconductor layer 130 to shield the corresponding semiconductor layer 130. Specifically, the vertical portion 172-21 may overlap and shield some of a first area 1131-1 and an eighth semiconductor 1138 and a ninth semiconductor 1139 extending from the first area 1131-1 of the first semiconductor 1131. Specifically, the shielding portion 172-23 may overlap and shield some of a second area 1131-2 and a third semiconductor 1133 and a sixth semiconductor 1136 extending from the second area 1131-2 of the first semiconductor 1131. As a result, the voltages of the first electrode and the second electrode of the driving transistor T1 and the electrode connected thereto may have a characteristic that is less influenced by the outside.

The second driving voltage line 172-2 may further include that additionally extends in the first direction from an end of the vertical portion 172-21 and that is connected to the ninth semiconductor 1139 of the ninth transistor T9 and the overlapping electrode Cn3 for the third transistor T3 through the opening OP1. As a result, the driving voltage ELVDD is transmitted to the first electrode of the ninth transistor T9, and the driving voltage ELVDD is transmitted to the overlapping electrode Cn3 for the third transistor T3 and the overlapping electrode Cn4 for the fourth transistor T4 unitary therewith. As a result, the voltage at one side of the additional capacitor is maintained at the driving voltage ELVDD, so that the voltage of the semiconductor layer 130 that overlaps the overlapping electrode Cn3 for the third transistor T3 and the overlapping electrode Cn4 for the fourth transistor T4 may be maintained constant.

In addition, the second driving voltage line 172-2 may further include the extending portion 172-25 additionally connected to the vertical portion 172-21 and the shielding portion 172-23. The extending portion 172-25 is connected to the first driving voltage line 172-1 through the opening OP1.

The first initialization voltage line 173 extends in the first direction, and is connected to the fourth semiconductor 1134 through the opening OP1 to transmit the first initialization voltage $V_{INT}$ to the first electrode of the fourth transistor T4.

The second reference voltage line 174-2 extends in the first direction, and is connected to the fifth semiconductor 1135 through the opening OP1 to transmit the reference voltage $V_{REF}$ to the first electrode of the fifth transistor T5. The first reference voltage line 174-1 extending from the fifth semiconductor 1135 is also formed or disposed in the semiconductor layer 130, and the reference voltage $V_{REF}$ may be transmitted through the semiconductor layer and the first data conductive layer.

The second initialization voltage line 175 extends in the first direction, and is connected to the (2-1)-th initialization voltage line 175-1 disposed on the semiconductor layer 130 through the opening OP1, so that the second initialization voltage $V_{AINT}$ may be transmitted through the semiconductor layer and the first data conductive layer.

The bias voltage line 176 extends in the first direction, and is connected to the eighth semiconductor 1138 through the opening OP1 to transmit the bias voltage $V_{bias}$ to the first electrode of the eighth transistor T8.

The signal line of the first data conductive layer will be described as follows.

The first scan line 161 to which the first scan signal GW(N) is applied extends in the first direction, and is connected to the second gate electrode 1152 through the opening OP1.

The second scan lines 162 and 162-1 to which the second scan signal GC(N) is applied are divided into two lines extending in the first direction. The (2-1)-th scan line 162 extends in the first direction and is connected to the third gate electrode 1153 through the opening OP1, the (2-2)-th scan line 162-1 extends in the first direction and is connected to the fifth gate electrode 1155 through the opening OP1. In some embodiments, two second scan lines 162 and 162-1 may be formed or provided as a single body, or scan signals having different timings may be applied to two second scan lines 162 and 162-1.

The third scan line 163 to which the third scan signal GI(N) is applied extends in the first direction, and is connected to the fourth gate electrode 1154 through the opening OP1.

The first light-emitting signal line 164 to which the first light-emitting control signal EM1(N) is applied extends in the first direction and is connected to the ninth gate electrode 1159 through the opening OP1, and the second light-emitting signal line 165 to which the second light-emitting control signal EM2(N) is applied extends in the first direction and is connected to the sixth gate electrode 1156 through the opening OP1.

The fourth scan line 166 to which the fourth scan signal EB(N) is applied extends in the first direction, and is connected to the seventh gate electrode 1157 and the eighth gate electrode 1158 unitary through the opening OP1.

The connecting member of the first data conductive layer will be described as follows.

One end of the first connecting member SD11 is connected to the gate electrode 1151 of the driving transistor T1 through the opening OP1, and the other end thereof is connected to the third semiconductor 1133 through the opening OP1. As a result, the gate electrode 1151 of the driving transistor T1 and the second electrode of the third transistor T3 are connected by the first connecting member SD11. When the first connecting member SD11 and the gate electrode 1151 of the driving transistor T1 are connected through the opening OP1, the first connecting member SD11 and the gate electrode 1151 are connected through the opening Cst2o defined at the second electrode Cst2 of the storage capacitor Cst. That is, the opening OP1 is defined in the opening Cst2o of the second electrode Cst2 of the storage capacitor Cst.

One end of the second connecting member SD12 is connected to the second electrode Cst2 of the storage capacitor Cst through the opening OP1, a middle portion thereof is connected to the first electrode ch1 of the first hold capacitor Chold1 (refer to FIG. 1) through the opening OP1, and the other end thereof is connected to a portion protruding between the second semiconductor 1132 and the fifth semiconductor 1135 through the opening OP1. As a result, the second electrode of the storage capacitor Cst, the first electrode of the first hold capacitor Chold1, the second electrode of the second transistor T2, and the second electrode of the fifth transistor T5 are connected to each other by the second connecting member SD12. In addition, since some of the second electrode Cst2 of the storage capacitor Cst also serves as the first electrode of the second hold capacitor Chold2, the first electrode of the second hold capacitor Chold2 is also connected together by the second connecting member SD12. When the second connecting member SD12 and the first electrode ch1 of the first hold capacitor Chold1 are connected through the opening OP1, the second connecting member SD12 and the first electrode ch1 are connected through the opening 172-10 defined at the first driving voltage line 172-1. That is, the opening OP1 is defined in the opening 172-10 of the first driving voltage line 172-1.

The third connecting member SD13 is connected to the second semiconductor 1132 through the opening OP1. The third connecting member SD13 is connected to the data line 171 of the second data conductive layer, which will be described later with reference to FIG. 13, and the data voltage $V_{DATA}$ is transmitted to the first electrode of the second transistor T2.

The fourth connecting member SD14 is connected to a portion protruding between the sixth semiconductor 1136 and the seventh semiconductor 1137 through the opening OP1. The fourth connecting member SD14 is connected to the second electrode of the sixth transistor T6 and the second electrode of the seventh transistor T7, and is a portion for connecting to be connected to the anode of the light-emitting diode LED. Since the position of the anode of the light-emitting diode LED may be different for each pixel, as shown in FIG. 11, each fourth connecting member SD14 may have a different shape for each adjacent pixel.

In an embodiment, the first data conductive layer may include a metal such as aluminum (Al), copper (Cu), molybdenum (Mo), titanium (Ti), or any metal alloys thereof, and may be formed or provided as a single layer or a multilayer.

Referring to FIG. 17, a first organic film 144 may be disposed on the first data conductive layer. In an embodiment, the first organic film 144 may be an organic insulation film including an organic material, and the organic material may include one or more of a polyimide, a polyamide, an acryl resin, benzocyclobutene, and a phenol resin.

Figure 12:
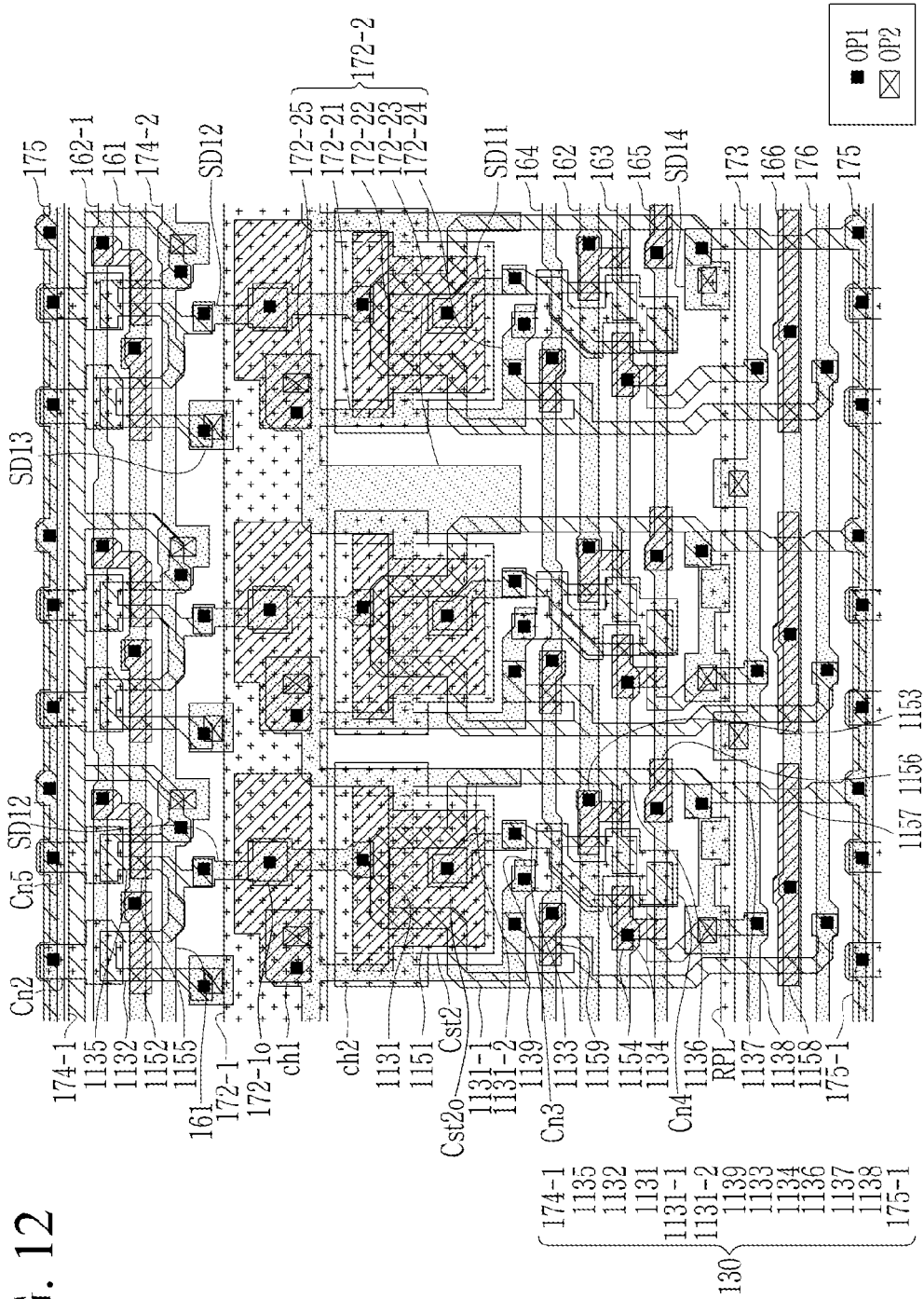

Referring to FIG. 12, an opening OP2 is defined in the first organic film 144. The opening OP2 exposes the first data conductive layer so that the first data conductive layer is connected to the second data conductive layer.

Figure 13:
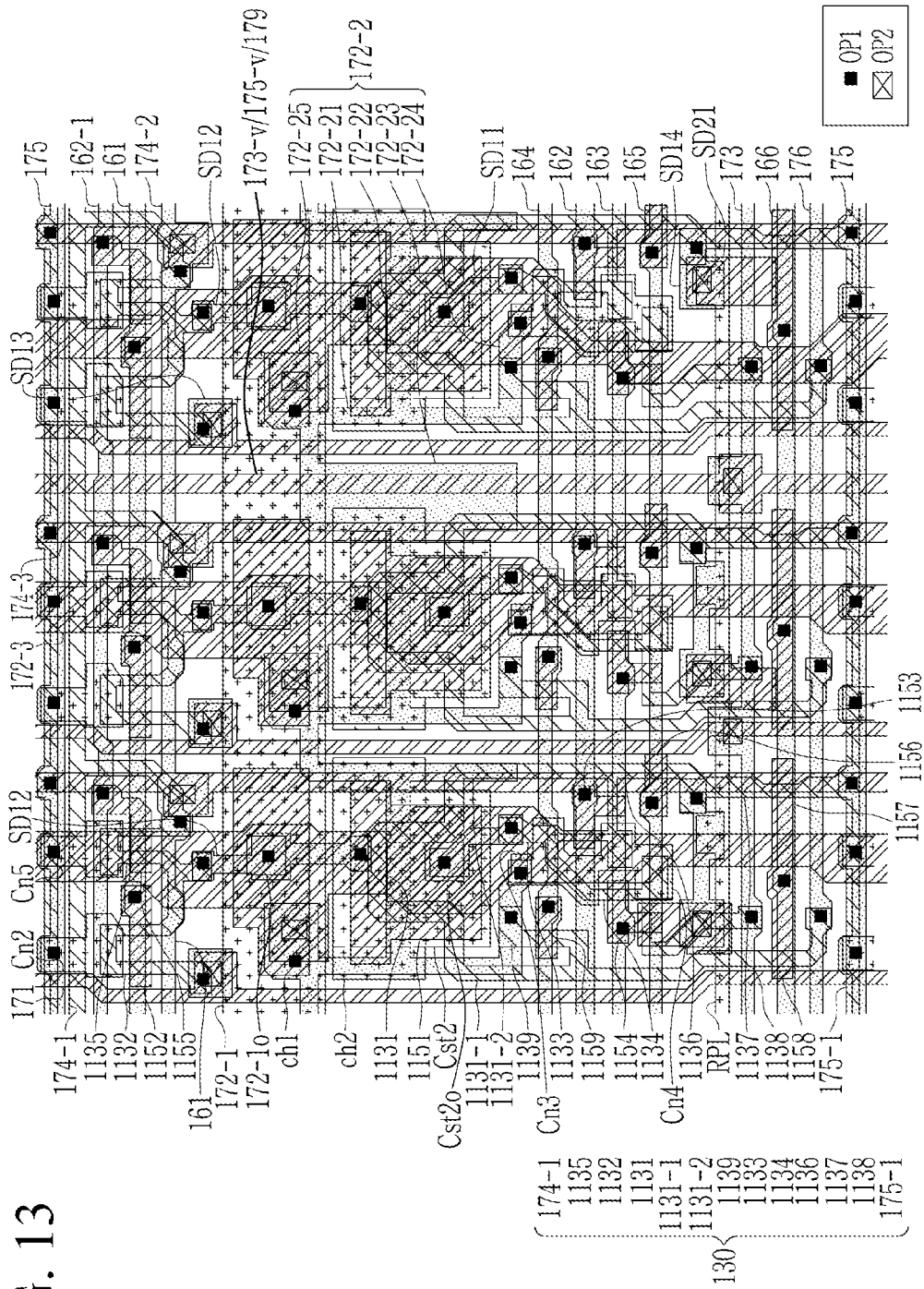

Referring to FIG. 13, the second data conductive layer may be disposed on the first organic film 144.

The second data conductive layer may include a data line 171 to which the data voltage $V_{DATA}$ is applied, a third driving voltage line 172-3 to which the driving voltage ELVDD is transmitted, a third reference voltage line 174-3 to which the reference voltage $V_{REF}$ is transmitted, and a fifth connecting member SD21.

The data line 171 extends in the second direction and is connected to the third connecting member SD13 through the opening OP2, and the third connecting member SD13 is connected to the second semiconductor 1132 through the opening OP1, so the data voltage $V_{DATA}$ passes through the third connecting member SD13 to be transferred to the first electrode of the second transistor T2.

The third driving voltage line 172-3 extends in the second direction and is connected to the extending portion 172-25 of the second driving voltage line 172-2 through the opening OP2. In addition, since the extending portion 172-25 of the second driving voltage line 172-2 is also connected to the first driving voltage line 172-1 through the opening OP1, the driving voltage ELVDD is transmitted in the second direction through the third driving voltage line 172-3, and is also transmitted even in the first direction through the second driving voltage line 172-2 and the first driving voltage line 172-1. Due to the driving voltage line having such a mesh structure, the driving voltage ELVDD may have a constant voltage value throughout the light-emitting display device.

The third reference voltage line 174-3 extends in the second direction and is connected to the second reference voltage line 174-2 through the opening OP2, and the second reference voltage line 174-2 is connected to the fifth semiconductor 1135 through the opening OP1, while the reference voltage $V_{REF}$ is also transmitted to the first reference voltage line 174-1, which is extended from the fifth semiconductor 1135. According to this structure, the reference voltage $V_{REF}$ is transmitted in the second direction through the third reference voltage line 174-3, and is also transmitted in the first direction through the second reference voltage line 174-2 and the first reference voltage line 174-1. Due to the reference voltage line having such a mesh structure, the reference voltage $V_{REF}$ may have a constant voltage value throughout the light-emitting display device.

The fifth connecting member SD21 is connected to the fourth connecting member SD14 through the opening OP2, and is connected to the second electrode of the sixth transistor T6 and the second electrode of the seventh transistor T7 through the opening OP1. In addition, the fifth connecting member SD21 is connected to the anode of the light-emitting diode LED through the opening (refer to OP3 in FIG. 14), so that the second electrode of the sixth transistor T6 and the second electrode of the seventh transistor T7 are connected to the anode.

The second data conductive layer may further include a vertical wire 173-1/175-$v$/179. The vertical wire may be a wire that transmits different voltages depending on positions thereof. That is, it may be a vertical (1-1)-th initialization voltage line 173-1 that transmits the first initialization voltage $V_{INT}$ in the second direction (vertical direction), it may be a second vertical initialization voltage line 175-$v$ that transmits the second initialization voltage $V_{AINT}$ in the second direction (vertical direction), or may be a driving low voltage line 179 that transmits the low driving voltage ELVSS in the second direction (vertical direction).

In an embodiment, the second data conductive layer may include a metal such as aluminum (Al), copper (Cu), molybdenum (Mo), titanium (Ti), or any metal alloys thereof, and may be formed or provided as a single layer or a multilayer.

In the above embodiment, it may be seen that the voltage lines transmitting various voltages have a structure in which the voltage lines are formed or disposed in a plurality of conductive layers and in which the voltage lines are connected to each other. Such a structure is such that the same voltage is transmitted to the mesh structure or to a plurality of layers so that the resistance is lowered so that the voltage drop is less, and the voltage difference is small according to the position of the pixel. Unlike the above embodiment, other voltage lines may also have a mesh structure or be formed or provided in a plurality of conductive layers.

Referring to FIG. 17, a second organic film 145 is disposed on the second data conductive layer. In an embodiment, the second organic film 145 may be an organic insulating film, and may include one or more of a polyimide, a polyamide, an acryl resin, benzocyclobutene, and a phenol resin.

Figure 14:
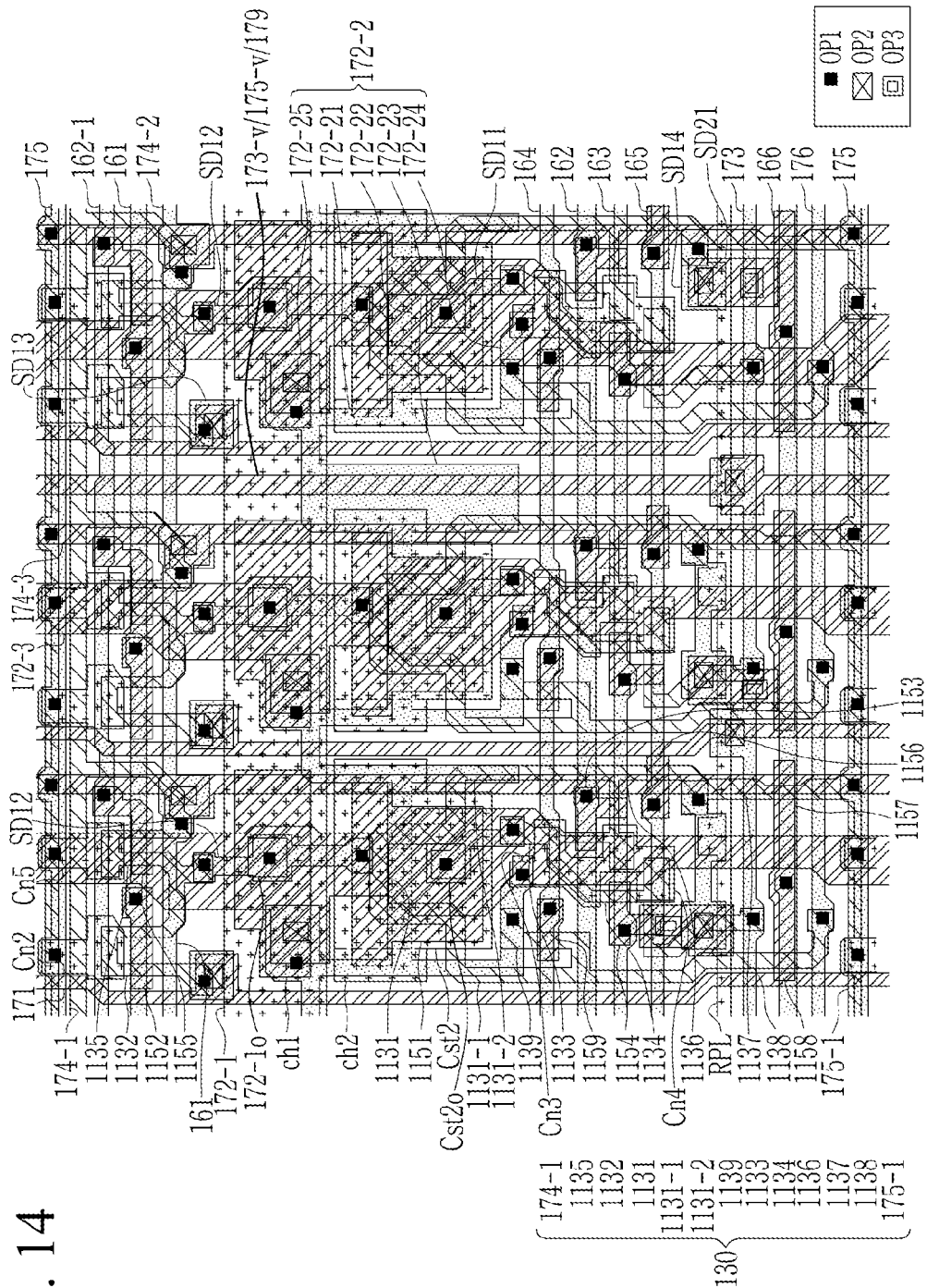

Referring to FIG. 14, an opening OP3 is defined in the second organic film 145, and the anode of the light-emitting diode LED disposed on the second organic film 145 and the fifth connecting member SD21 disposed in the second data conductive layer are connected to each other through the opening OP3. As a result, the second electrode of the sixth transistor T6 and the second electrode of the seventh transistor T7 are connected to the anode, and the output current of the driving transistor T1 may be transmitted to the anode of the light-emitting diode LED through the sixth transistor T6.

Although not shown, a structure of an upper portion of the second organic film 145 will be briefly described as follows.

The light-emitting diode LED configuring a pixel may be formed or disposed on the upper portion of the second organic film 145. An anode is formed or disposed on the second organic film 145, and a pixel defining film having an opening overlapping the anode is disposed. The pixel defining film overlaps a portion of the anode, and the remaining anode may be exposed by an opening. A spacer may be disposed on the pixel defining film.

The light-emitting layer is disposed in the opening of the pixel defining film and on the anode, and a cathode is disposed on the pixel defining film and the light-emitting layer. The light-emitting layer may include an organic light-emitting material, and adjacent light-emitting layers may display different colors. In some embodiments, by additionally forming a color filter or a color conversion layer, which is disposed on the upper portion thereof, it is possible to display a color.

An encapsulation layer or an encapsulation substrate may be formed or disposed on the cathode to protect the light-emitting layer including an organic material from moisture or oxygen that may be introduced from the outside. The encapsulation layer may include an inorganic layer and an organic layer, and may include a triple-layered structure of an inorganic layer, an organic layer, and an inorganic layer.

In some embodiments, a sensing electrode may be further formed or disposed on the encapsulation layer to enable touch sensing. In some embodiments, a polarizer may be formed or provided at an outermost side of the light-emitting display device. The polarizer may prevent display quality from being deteriorated while a user recognizes incident external light reflected by the anode, the cathode, the sensing electrode, or the like.

In the above, the planar structure of the pixel circuit part of the pixel of the light-emitting display device in the embodiment has been described in detail.

Hereinafter, characteristics according to the gate electrode 1151 of the driving transistor T1 having a T-shape and the second electrode Cst2 of the storage capacitor Cst will be described in detail with reference to FIG. 15 to FIG. 17.

Figure 15:
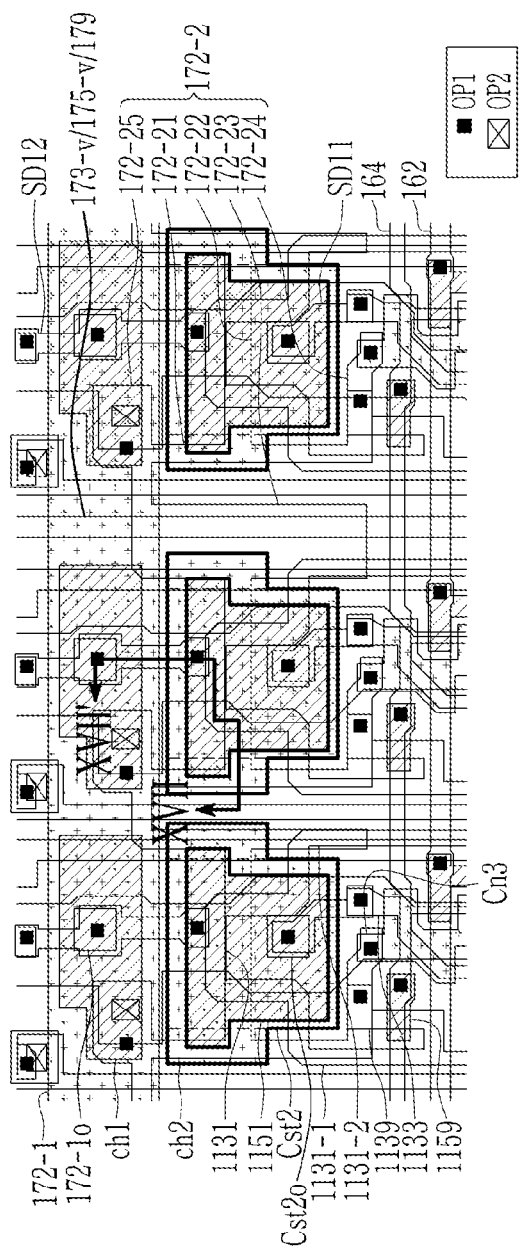
FIG. 15 illustrates an enlarged top plan view of a portion of FIG. 14.
Figure 16:
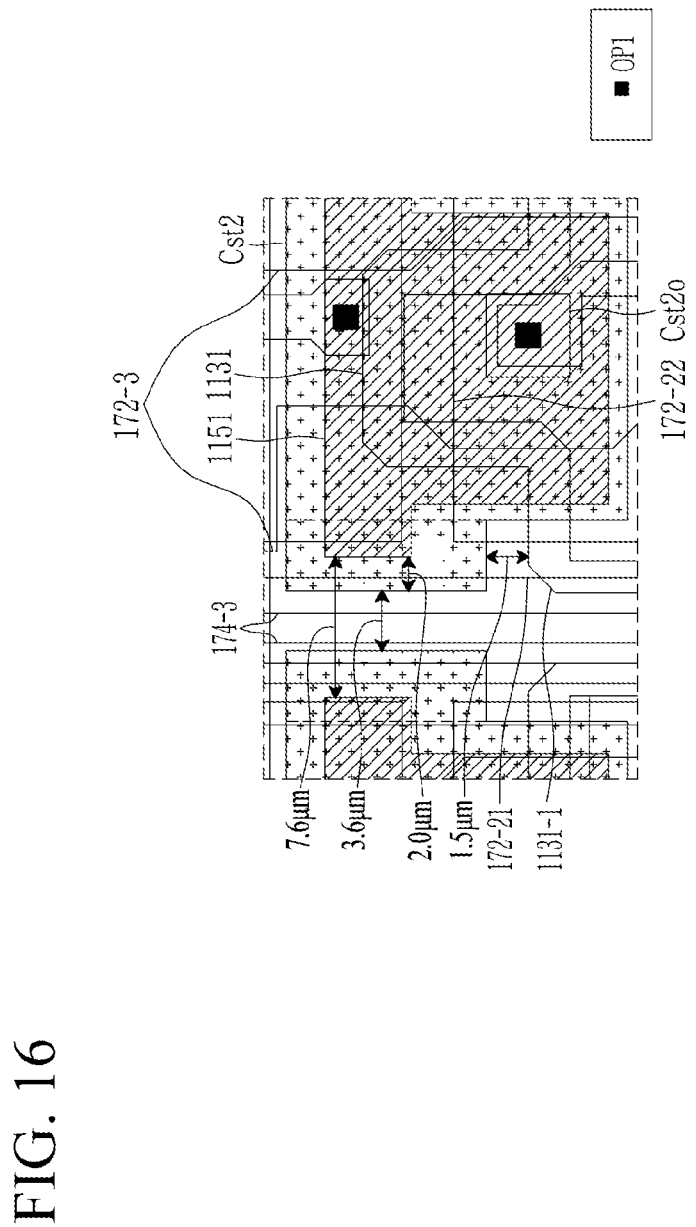
FIG. 16 illustrates a gap in a portion of FIG. 15.

FIG. 15 illustrates an enlarged top plan view of a portion of FIG. 14, FIG. 16 illustrates a gap in a portion of FIG. 15, and FIG. 17 illustrates a cross-sectional view taken along line XVII-XVII' of FIG. 15.

Referring to FIG. 15 and FIG. 17, the gate electrode 1151 of the driving transistor T1 plays two roles configuring the first semiconductor 1131 and the driving transistor T1 disposed below the substrate 110 and configuring the storage capacitor Cst while overlapping the second electrode Cst2 of the storage capacitor Cst disposed upward in a direction away from the substrate 110.

In addition, since the second electrode Cst2 of the storage capacitor Cst not only configures the storage capacitor Cst together with the gate electrode 1151 of the driving transistor T1 therebelow but also configures the second hold capacitor Chold2 while overlapping the second driving voltage line 172-2 disposed thereabove, it also serves as the first electrode of the second hold capacitor Chold2.

The first hold capacitor Chold1 is formed or provided by the first electrode ch1 of the first hold capacitor Chold1 disposed in the first gate conductive layer and the first driving voltage line 172-1 disposed in the second gate conductive layer overlapping each other. Among them, the first electrode ch1 of the first hold capacitor Chold1 is connected to the second electrode Cst2 of the storage capacitor Cst through the second connecting member SD12.

In the capacitor structure as described above, when the gate electrode 1151 of the driving transistor T1 and the second electrode Cst2 of the storage capacitor Cst are extended to have a T-shape, the following characteristics may be obtained.

First, since an overlapping area of two electrodes (the gate electrode 1151 of the driving transistor T1 and the second electrode Cst2 of the storage capacitor Cst) configuring the storage capacitor Cst increases, the capacitance of the storage capacitor Cst increases. As a result, there is an advantage that the voltage of the gate electrode 1151 of the driving transistor T1 is not easily changed.

In addition, an overlapping area of the second electrode Cst2 of the storage capacitor Cst and the second driving voltage line 172-2 disposed in the data conductive layer also increases. Particularly, as it has a T-shape and has a portion (the first additional electrode ch2 of the second hold capacitor Chold2) extending to the left and right, the capacitance of the second hold capacitor Chold2 increases. As a result, the voltage at one end of the second hold capacitor Chold2 is well maintained. In addition, the first electrode ch1 of the first hold capacitor Chold1 connected to the second electrode Cst2 of the storage capacitor Cst through the second connecting member SD12 may have a more stable voltage.

Due to the increase in capacitance as described above, the voltage of the gate electrode 1151 of the driving transistor T1 may be maintained to reduce a luminance difference that may occur in a high gray during the low frequency driving, and to eliminate crosstalk or reduce power consumption during the high frequency driving, so that the display quality of the light-emitting display device is improved.

FIG. 16 illustrates a gap between the gate electrode 1151 of the driving transistor T1, the second electrode Cst2 of the storage capacitor Cst, and a portion (first area 1131-1) of the first semiconductor 1131 of the semiconductor layer 130, which are adjacent to each other.

In FIG. 16, a gap between the gate electrodes 1151 of two adjacent driving transistors T1 is illustrated as about 7.6 micrometers (μm), and may have a value of about 2 μm or more and about 10 μm or less. A gap between the second electrodes Cst2 of two adjacent storage capacitors Cst is illustrated as about 3.6 μm, and may have a value of about 2 μm or more and about 5 μm or less. A gap between the gate electrode 1151 of the driving transistor T1 and the second electrode Cst2 of the storage capacitor Cst is illustrated as about 2.0 μm, and may have a value of about 1 μm or more and about 3 μm or less. A gap in the second direction between the first area 1131-1 of the first semiconductor 1131 and the second electrode Cst2 of the storage capacitor Cst is illustrated as about 1.5 μm, and may have a value of about 0.4 μm or more and about 2.5 μm or less. Although the above numerical values are values in the embodiment, the influence between adjacent pixels may be minimized by configuring to have such gaps. That is, when the gap is narrower than this, a problem that the pixel may be affected may occur due to the voltage change of adjacent pixels in the first direction. In addition, even within the same pixel, a sufficient capacitance may be maintained by maintaining the gap of the above-described numerical value, and the influence with adjacent portions may be reduced, thereby improving display quality.

Hereinafter, a cross-section of an overall light-emitting display panel along with a cross-sectional structure of a capacitor will be described with reference to FIG. 17 as follows.

The semiconductor layer 130 including the first semiconductor 1131 of the driving transistor T1 is disposed on the substrate 110. The semiconductor layer 130 includes a channel area, and a first area and a second area disposed at opposite sides of the channel area.

The substrate 110 and the semiconductor layer 130 are covered by the first gate insulating film 141. In some embodiments, the first gate insulating film 141 may be disposed only on the semiconductor layer 130.

The first gate conductive layer including the gate electrode 1151 of the driving transistor T1 and the first electrode ch1 of the first hold capacitor Chold1 is disposed on the first gate insulating film 141. An area of the semiconductor layer 130 overlapping the gate electrode in a plan view may be the channel area, and the channel area of the driving transistor T1 may be a portion overlapping the gate electrode 1151 of the driving transistor T1.

The first gate conductive layer is covered by the second gate insulating film 142, and the second gate conductive layer including the second electrode Cst2 of the storage capacitor Cst and the first driving voltage line 172-1 is disposed on the second gate insulating film 142.

The second electrode Cst2 of the storage capacitor Cst overlaps the gate electrode 1151 of the driving transistor T1 to form the storage capacitor Cst, and the first driving voltage line 172-1 overlaps the first electrode ch1 of the first hold capacitor Chold1 to form the first hold capacitor Chold1.

The second electrode Cst2 of the storage capacitor Cst overlaps the second data conductive layer (second driving voltage line 172-2) to be described later to configure the second hold capacitor Chold2, and a portion of the second electrode Cst2 of the storage capacitor Cst configures the first additional electrode ch2 of the second hold capacitor Chold2 so that the second hold capacitor Chold2 has a larger capacitance. The first additional electrode ch2 of the second hold capacitor Chold2 may have a T-shape in FIG. 15 and FIG. 16, which may correspond to the left and right extending portion.

An opening 172-10 is defined in the first driving voltage line 172-1 so that the second data conductive layer (second connecting member SD12) to be described later may be connected to the first electrode ch1 of the first hold capacitor Chold1.

The second gate conductive layer is covered by the first inter-insulating film 143, and the first data conductive layer including the second driving voltage line 172-2 and the second connecting member SD12 is disposed on the first inter-insulating film 143.

The second driving voltage line 172-2 overlaps the second electrode Cst2 of the storage capacitor Cst to configure the second hold capacitor Chold2. In FIG. 15 and FIG. 16, the capacitance of the second hold capacitor Chold2 is largely generated due to the first additional electrode ch2 of the second hold capacitor Chold2 that has a T-shape and is a portion extending in the left and right. In addition, since the second electrode Cst2 of the storage capacitor Cst has a T-shape and extends left and right, the capacitance of the storage capacitor Cst is also largely generated.

One end of the second connecting member SD12 is connected to the first electrode ch1 of the first hold capacitor Chold1 through the opening 172-10 of the first driving voltage line 172-1 and the opening OP1 defined in the first inter-insulating film 143 and the second gate insulating film 142. In addition, the other end of the second connecting member SD12 is connected to the second electrode Cst2 of the storage capacitor Cst and the first additional electrode ch2 of the second hold capacitor Chold2 through the opening OP1 defined in the first inter-insulating film 143.

In the first hold capacitor Chold1, the first electrode is disposed in the first gate conductive layer and the second electrode is disposed in the second gate conductive layer, while in the second hold capacitor Chold2, the first electrode is disposed in the second gate conductive layer and the second electrode is disposed in the first gate conductive layer. That is, in a cross-sectional view, in the first hold capacitor Chold1 and the second hold capacitor Chold2, it is the same in that the first electrode is disposed below and the second electrode is disposed above, but the positions at which respective electrodes are formed or provided are different. That is, the conductive layers in which the first electrode of the first hold capacitor Chold1 and the first electrode of the second hold capacitor Chold2 are disposed are different, and the conductive layers in which the second electrode of the first hold capacitor Chold1 and the second electrode of the second hold capacitor Chold2 are disposed are also different.

The first data conductive layer is covered by the first organic film 144, and the second data conductive layer is disposed on the first organic film 144. Although not shown in FIG. 17, referring to FIG. 12, the opening OP2 is disposed on the first organic film 144, so that the second data conductive layer and the first data conductive layer may be connected.

The second data conductive layer is covered by the second organic film 145, and although not shown in FIG. 17, referring to FIG. 14, the opening OP3 is disposed on the second organic film 145, so that the anode and the second data conductive layer may be connected. The light-emitting diode LED including the anode, the light-emitting layer, and the cathode may be disposed on the second organic film 145.

In the above, the pixel having the circuit structure of FIG. 1 has been mainly described. However, in some embodiments, the circuit of the pixel may be modified as shown in FIG. 18.

Figure 18:
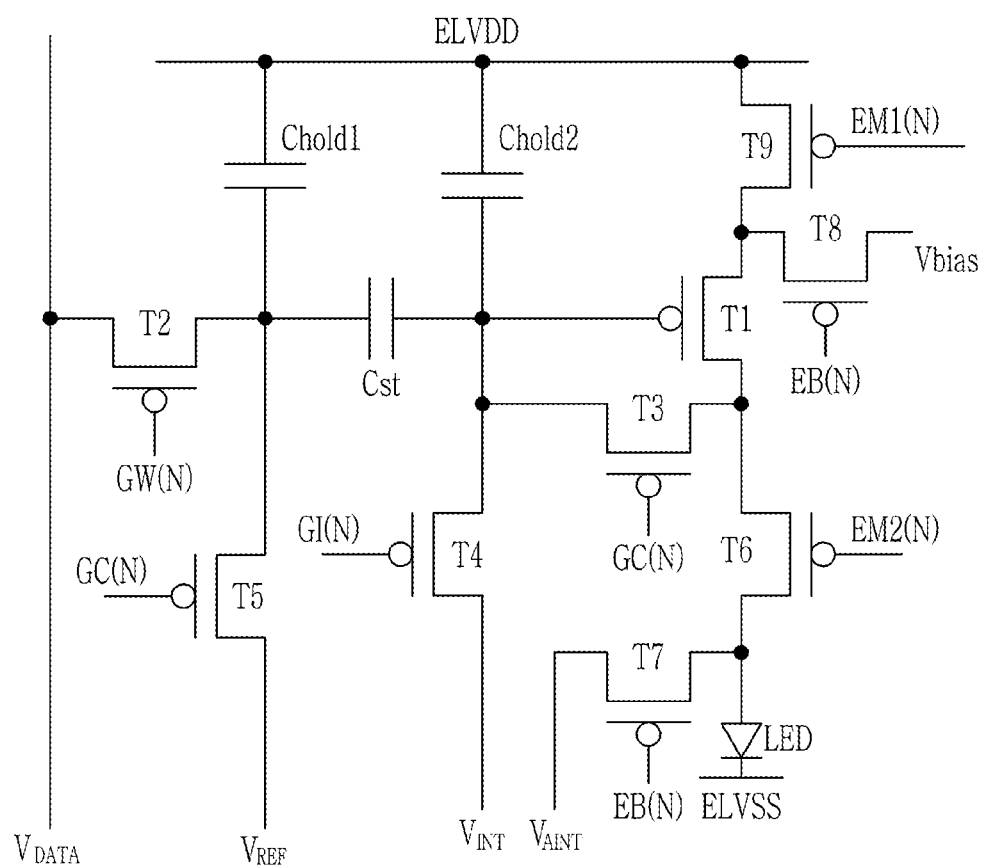
FIG. 18 illustrates an equivalent circuit diagram of another embodiment of one pixel included in a light-emitting display device.

FIG. 18 illustrates an equivalent circuit diagram of another embodiment of one pixel included in a light-emitting display device.

The pixel circuit structure of FIG. 18 includes the same constituent elements as FIG. 1 (9 transistors, the light-emitting diode LED, the storage capacitor Cst, the first hold capacitor Chold1, and the second hold capacitor Chold2), but, unlike in FIG. 1, the first electrode of the second hold capacitor Chold2 is connected to the gate electrode of the driving transistor T1.

That is, in the structure of the pixel circuit of FIG. 18, the second hold capacitor Chold2 includes a first electrode connected to the gate electrode of the driving transistor T1 and a second electrode to which the driving voltage ELVDD is applied. The first electrode of the second hold capacitor Chold2 is additionally connected to the first electrode of the storage capacitor Cst, the second electrode of the third transistor T3, and the second electrode of the fourth transistor T4.

In the embodiment of FIG. 18, an equivalent capacitor viewed from the gate electrode of the driving transistor T1 has a structure in which the storage capacitor Cst and the first hold capacitor Chold1 connected in series are connected in parallel with the second hold capacitor Chold2.

When capacitance (hereinafter also referred to as equivalent capacitance or converted capacitance) of the equivalent capacitor at the gate electrode of the driving transistor T1 in the structure of FIG. 18 described above is calculated, a value of Equation 2 below may be obtained.

$$\text{Converted capacitance} = (C1 \times C2 + C2 \times C3 + C3 \times C1)/(C1 + C2) \qquad \text{[Equation 2]}$$

In Equation 2, C1 represents a capacitance of the storage capacitor Cst, C2 represents a capacitance of the first hold capacitor Chold1, and C3 represents a capacitance of the second hold capacitor Chold2.

In Equation 2, the converted capacitance value has a larger value when the value of C3 exists, that is, when the second hold capacitor Chold2 is formed or provided, than when the value of C3 is 0, that is, when the second hold capacitor Chold2 is not formed or provided. Therefore, the pixel having the circuit diagram of FIG. 18 has an advantage that the gate voltage of the driving transistor T1 is less influenced by the surroundings. As such, the gate voltage of the driving transistor T1 may be well maintained, so that a luminance difference that may occur in a high gray level when being driven at a low frequency may be reduced, and crosstalk may be eliminated or power consumption may be reduced when being driven at a high frequency.

In FIG. 18, only the connecting position of the second hold capacitor Chold2 is different from that of FIG. 1, and the connection of other constituent elements is the same, so that the waveform diagram of FIG. 2 is applied as in FIG. 1 and the same operation may be performed.

Above, the pixel further including the additional capacitance has been described. When the capacitance of the pixel is additionally generated as described above, the resolution may be increased by reducing the size of the pixel, and thus the value of the number of pixels per inch (ppi) may be improved. That is, when a pixel is operated, a target value of a desired capacitance exists, and a minimum area of the pixel is determined to satisfy the target value. However, as shown in FIG. 7 to FIG. 17, when the gate electrode 1151 of the driving transistor T1 and the second electrode Cst2 of the storage capacitor Cst extend left and right in a T-shape, the target capacitance value without significantly increasing the pixel area may be matched, so the area occupied by the pixel may be relatively reduced. As a result, in the light-emitting display device having the same size, it is possible to realize higher resolution or pixels per inch (ppi).

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A light-emitting display device, comprising:
a first transistor including a driving gate electrode, a first electrode, and a second electrode;
a storage capacitor including a first electrode and a second electrode connected to the driving gate electrode;
a second transistor connected to the second electrode of the storage capacitor;
a first hold capacitor including a first electrode connected to the second electrode of the storage capacitor and a second electrode to which a driving voltage is applied;
a second hold capacitor including a first electrode connected to the second electrode of the storage capacitor and a second electrode to which thea driving voltage is applied;
a third transistor connecting the driving gate electrode and the second electrode of the first transistor;
a light-emitting diode including an electrode;
a fourth transistor which initializes a voltage of the driving gate electrode to a first initialization voltage; and
a seventh transistor which initializes a voltage of the electrode of the light-emitting diode to a second initialization voltage,
wherein conductive layers, in which the first electrode of the first hold capacitor and the first electrode of the second hold capacitor are disposed, are different from each other.

2. The light-emitting display device of claim 1, further comprising:
a fifth transistor changing a voltage of the second electrode of the storage capacitor to a reference voltage.

3. The light-emitting display device of claim 2, further comprising:
a sixth transistor connecting the electrode of the light-emitting diode and the second electrode of the first transistor.

4. The light-emitting display device of claim 3, further comprising:
an eighth transistor which transmits a bias voltage to the first electrode of the first transistor; and
a ninth transistor which transmits the driving voltage to the first electrode of the first transistor.

5. The light-emitting display device of claim 4, wherein a period in which the second transistor is turned on and a period in which the third transistor is turned on are separated from each other, and
the ninth transistor is turned on during the period in which the third transistor is turned on.

6. The light-emitting display device of claim 4, wherein the sixth transistor and the ninth transistor are turned on together, so that the light-emitting diode emits light.

7. The light-emitting display device of claim 1, wherein conductive layers in which the second electrode of the first hold capacitor and the second electrode of the second hold capacitor are disposed are different.

8. A light-emitting display device, comprising:
a first transistor including a driving gate electrode, a first electrode, and a second electrode;
a storage capacitor including a first electrode and a second electrode connected to the driving gate electrode;
a second transistor connected to the second electrode of the storage capacitor;
a first hold capacitor including a first electrode connected to the second electrode of the storage capacitor and a second electrode to which a driving voltage is applied;
a second hold capacitor including a first electrode connected to the driving gate electrode and a second electrode to which the driving voltage is applied;
a third transistor connecting the driving gate electrode and the second electrode of the first transistor;
a light-emitting diode including an electrode;
a fourth transistor which initializes a voltage of the driving gate electrode to a first initialization voltage; and
a seventh transistor which initialize a voltage of the electrode of the light-emitting diode to a second initialization voltage.

9. The light-emitting display device of claim 8, further comprising:
a fifth transistor which changes a voltage of the second electrode of the storage capacitor to a reference voltage.

10. The light-emitting display device of claim 9, further comprising:
a sixth transistor connecting the electrode of the light-emitting diode and the second electrode of the first transistor.

11. The light-emitting display device of claim 10, further comprising:
an eighth transistor which transmits a bias voltage to the first electrode of the first transistor; and
a ninth transistor which transmits the driving voltage to the first electrode of the first transistor.

12. The light-emitting display device of claim 11, wherein a period in which the second transistor is turned on and a period in which the third transistor is turned on are separated from each other, and the ninth transistor is turned on during the period in which the third transistor is turned on.

13. The light-emitting display device of claim 11, wherein the sixth transistor and the ninth transistor are turned on together, so that the light-emitting diode emits light.

14. A light-emitting display device, comprising:
a first transistor including a driving gate electrode, a first electrode, and a second electrode;
a storage capacitor including a first electrode and a second electrode connected to the driving gate electrode;
a second transistor connected to the second electrode of the storage capacitor;
a first hold capacitor including a first electrode connected to the second electrode of the storage capacitor and a second electrode to which a driving voltage is applied;
a second hold capacitor including a first electrode connected to the second electrode of the storage capacitor and a second electrode to which the driving voltage is applied;
a third transistor connecting the driving gate electrode and the second electrode of the first transistor; and
a light-emitting diode including an electrode,
wherein conductive layers, in which the first electrode of the first hold capacitor and the first electrode of the second hold capacitor are disposed, are different from each other,
wherein the light-emitting display device further includes:
a substrate;
a semiconductor layer disposed on the substrate;
a first gate conductive layer disposed on the semiconductor layer;
a second gate conductive layer disposed on the first gate conductive layer; and
a first data conductive layer disposed on the second gate conductive layer,
wherein the driving gate electrode is disposed in the first gate conductive layer,
the second electrode of the storage capacitor is disposed in the second gate conductive layer, and
each of the driving gate electrode and the second electrode of the storage capacitor extends in a first direction to have a T-shape.

15. The light-emitting display device of claim 14, wherein the first electrode of the first hold capacitor is disposed in the first gate conductive layer,
the first electrode of the second hold capacitor is disposed in the second gate conductive layer,
the second electrode of the first hold capacitor is disposed in the second gate conductive layer, and
the second electrode of the second hold capacitor is disposed in the first data conductive layer.

16. The light-emitting display device of claim 15, wherein the first electrode of the first hold capacitor and the first electrode of the second hold capacitor are connected by a connecting member disposed in the first data conductive layer.

17. The light-emitting display device of claim 15, wherein when a portion of the second electrode of the storage capacitor having the T-shape to extend in the first direction is referred to as a first additional electrode of the second hold capacitor,
the first additional electrode of the second hold capacitor, while at least partially overlapping a driving voltage line which is disposed on the first data conductive layer and to which the driving voltage is transmitted, additionally constitutes the second hold capacitor.

18. The light-emitting display device of claim 17, wherein:
the driving voltage line disposed in the first data conductive layer is bent and extended in the first direction, and includes a portion extending in a second direction perpendicular to the first direction; and
the portion extending in the second direction and the first additional electrode of the second hold capacitor overlap in a plan view.

19. The light-emitting display device of claim 18, wherein the portion extending in the second direction of the driving voltage line disposed in the first data conductive layer is a vertical portion or a shielding portion.

20. The light-emitting display device of claim 19, wherein the vertical portion and the shielding portion of the driving voltage line disposed in the first data conductive layer are connected by a horizontal portion extending in the first direction.

* * * * *